(12) United States Patent
Tamura

(10) Patent No.: US 9,214,524 B2
(45) Date of Patent: Dec. 15, 2015

(54) METHOD OF MANUFACTURING A SEMICONDUCTOR DEVICE

(75) Inventor: Naoyoshi Tamura, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 292 days.

(21) Appl. No.: 13/586,091

(22) Filed: Aug. 15, 2012

(65) Prior Publication Data

US 2012/0309176 A1  Dec. 6, 2012

Related U.S. Application Data

(62) Division of application No. 12/261,173, filed on Oct. 30, 2008, now Pat. No. 8,269,256.

(30) Foreign Application Priority Data

Nov. 1, 2007 (JP) .................................. 2007-285565

(51) Int. Cl.
| | | |
|---|---|---|
| H01L 21/8236 | (2006.01) | |
| H01L 29/417 | (2006.01) | |
| H01L 21/8238 | (2006.01) | |
| H01L 29/78 | (2006.01) | |
| H01L 29/165 | (2006.01) | |
| H01L 29/66 | (2006.01) | |

(52) U.S. Cl.
CPC .. *H01L 29/41783* (2013.01); *H01L 21/823807* (2013.01); *H01L 21/823814* (2013.01); *H01L 29/6653* (2013.01); *H01L 29/6659* (2013.01); *H01L 29/66636* (2013.01); *H01L 29/7848* (2013.01); *H01L 29/165* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 6,869,866 B1 | 3/2005 | Chidambarrao et al. | |
| 7,105,393 B2 * | 9/2006 | Yao et al. | 438/167 |
| 7,247,583 B2 | 7/2007 | Kurita et al. | |

(Continued)

FOREIGN PATENT DOCUMENTS

| | | |
|---|---|---|
| JP | 2005-244187 A | 9/2005 |
| JP | 2006-186240 A | 7/2006 |
| JP | 2006-261283 A | 9/2006 |
| JP | 2008-78347 A | 4/2008 |

OTHER PUBLICATIONS

Japanese Office Action dated Nov. 6, 2012, issued in corresponding Japanense Patent Application No. 2007-285565, (9 pages). With Partial English Translation.

(Continued)

*Primary Examiner* — Evan Pert
*Assistant Examiner* — Shaka White
(74) *Attorney, Agent, or Firm* — Westerman, Hattori, Daniels & Adrian, LLP

(57) ABSTRACT

A semiconductor device includes a semiconductor substrate, a gate insulating film formed over the semiconductor substrate, a gate electrode formed on the gate insulating film, a first semiconductor layer which is embedded into a portion on both sides of the gate electrode in the semiconductor substrate, and which includes Si and a 4B group element other than Si, and a second semiconductor layer which is embedded into the portion on both sides of the gate electrode in the semiconductor substrate, so as to be superposed on the first semiconductor layer, and which includes Si and a 4B group element other than Si, wherein the gate electrode is more separated from an end of the first semiconductor layer than from an end of the second semiconductor layer.

9 Claims, 24 Drawing Sheets

(56) References Cited

U.S. PATENT DOCUMENTS

| | | |
|---|---|---|
| 7,554,110 B2 | 6/2009 | Yu et al. |
| 7,750,338 B2 * | 7/2010 | Wang .............................. 257/19 |
| 2006/0138398 A1 | 6/2006 | Shimamune et al. |
| 2007/0228417 A1 * | 10/2007 | Yasutake ....................... 257/192 |
| 2008/0128746 A1 | 6/2008 | Wang |
| 2008/0246057 A1 | 10/2008 | Lin et al. |

OTHER PUBLICATIONS

Self-aligned gate. <http://en.wikipedia.org/wiki/Self-aligned_gate> Accessed Dec. 18, 2010.

* cited by examiner

FIG. 4

| PMOS | $\sigma_{LONG}$ | $\sigma_{PERP}$ | $\Delta\mu/\mu$ |
|---|---|---|---|
| PRESENT EMBODIMENT | $-1.72 \times 10^{10}$ | $2.99 \times 10^{10}$ | 112.53 |
| COMPARISON EXAMPLE 1 | $-1.42 \times 10^{10}$ | $1.32 \times 10^{10}$ | 88.93 |
| COMPARISON EXAMPLE 2 | $-1.12 \times 10^{10}$ | $5.94 \times 10^{9}$ | 66.53 |
| COMPARISON EXAMPLE 3 | $-1.97 \times 10^{9}$ | $1.81 \times 10^{9}$ | 0 |

METHOD OF MANUFACTURING A SEMICONDUCTOR DEVICE

CROSS-REFERENCE TO RELATED APPLICATIONS

This application is a divisional application of U.S. patent application Ser. No. 12/261,173 filed Oct. 30, 2008, and is based upon and claims the benefit of priority from Japanese Pat. Application No. 2007-285565 filed Nov. 1, 2007, the entire contents of which being incorporated herein by reference.

BACKGROUND

1. Field

The present invention relates to a semiconductor device and a manufacturing method thereof.

2. Description of the Related Art

In an LSI of a so-called 90 nm node, or finer in recent years, further microminiaturization has been required. As a result, it becomes difficult to improve the performance of a transistor. This is because since a standby off-leak current is increased according to the reduction in the gate length of transistor, when the off-leak current is intended to be suppressed to a fixed level, it is extremely difficult to improve the current drive capability of the transistor. Therefore, a new approach for improving the capability of the transistor has been investigated.

There is a strained silicon technique as one attempt of the approach. The strained silicon technique is a technique which improves the current drive capability by improving the carrier mobility in such a manner that the band structure is changed by applying a stress to a channel region so as to reduce the effective mass of the carriers.

It is known that in a p-channel MOS transistor, the carrier mobility is improved by applying a uniaxial compressive stress to a channel region. As a specific example in which a compressive stress is applied to the channel region, there is proposed a transistor having a so-called embedded structure in which a recessed portion is formed in a source/drain region and in which a SiGe layer is embedded into the recessed portion by an epitaxial method (Japanese Patent Laid-Open No. 2006-186240).

On the other hand, in an n-channel MOS transistor, there is proposed a transistor having a so-called embedded structure in which a recessed portion is formed in a source/drain region similarly to the p-channel MOS transistor and in which a SiC layer is embedded into the recessed portion by an epitaxial method.

Since SiGe has a lattice constant larger than that of silicon, a crystal of a SiGe layer is, in a sense, forcibly lattice-matched with a silicon substrate in the substrate in-plane direction. Thereby, the silicon substrate is expanded in the direction perpendicular to the substrate. As a result, a compressive strain is introduced into the channel region in the substrate in-plane direction, that is, in the channel direction, so that a compressive stress is applied to the channel region. The symmetry of the Si crystal which forms the channel region is locally changed as a result of the uniaxial compressive stress being applied to the channel region. Further, according to the change in symmetry, the degeneration between the heavy hole valence band and the light hole valence band is eliminated, so that the hole mobility in the channel region is increased to thereby improve the operating speed of the transistor. The increase in the hole mobility effected by the stress locally induced in the channel region, and the improvement in the transistor operating speed resulting from the increase in the hole mobility, remarkably appear in an ultrafine semiconductor device having a gate length of 100 nm or less, in particular.

On the other hand, in the case of a SiC layer, since SiC has a lattice constant smaller than that of silicon, the crystal of the SiC layer is forcibly lattice-matched with the silicon substrate in the substrate in-plane direction. As a result, a tensile strain is introduced into the channel region in the substrate in-plane direction, that is, in the channel direction, so that a tensile stress is applied to the channel region.

SUMMARY

According to an aspect of present invention, a semiconductor device includes a semiconductor substrate, a gate insulating film formed over the semiconductor substrate, a gate electrode formed on the gate insulating film, a first semiconductor layer which is embedded into a portion on both sides of the gate electrode in the semiconductor substrate, and which includes Si and a 4B group element other than Si, and a second semiconductor layer which is embedded into the portion on both sides of the gate electrode in the semiconductor substrate, so as to be superposed on the first semiconductor layer, and which includes Si and a 4B group element other than Si, wherein the gate electrode is more separated from an end of the first semiconductor layer than from an end of the second semiconductor layer.

BRIEF DESCRIPTION OF THE DRAWINGS

FIG. 4 shows stress values corresponding to FIG. 3;

DESCRIPTION OF THE PREFERRED EMBODIMENTS

First, a semiconductor device according to the present embodiment will be described. Here, a p-channel MOS transistor is taken as an example of the semiconductor device.

Figure 1:
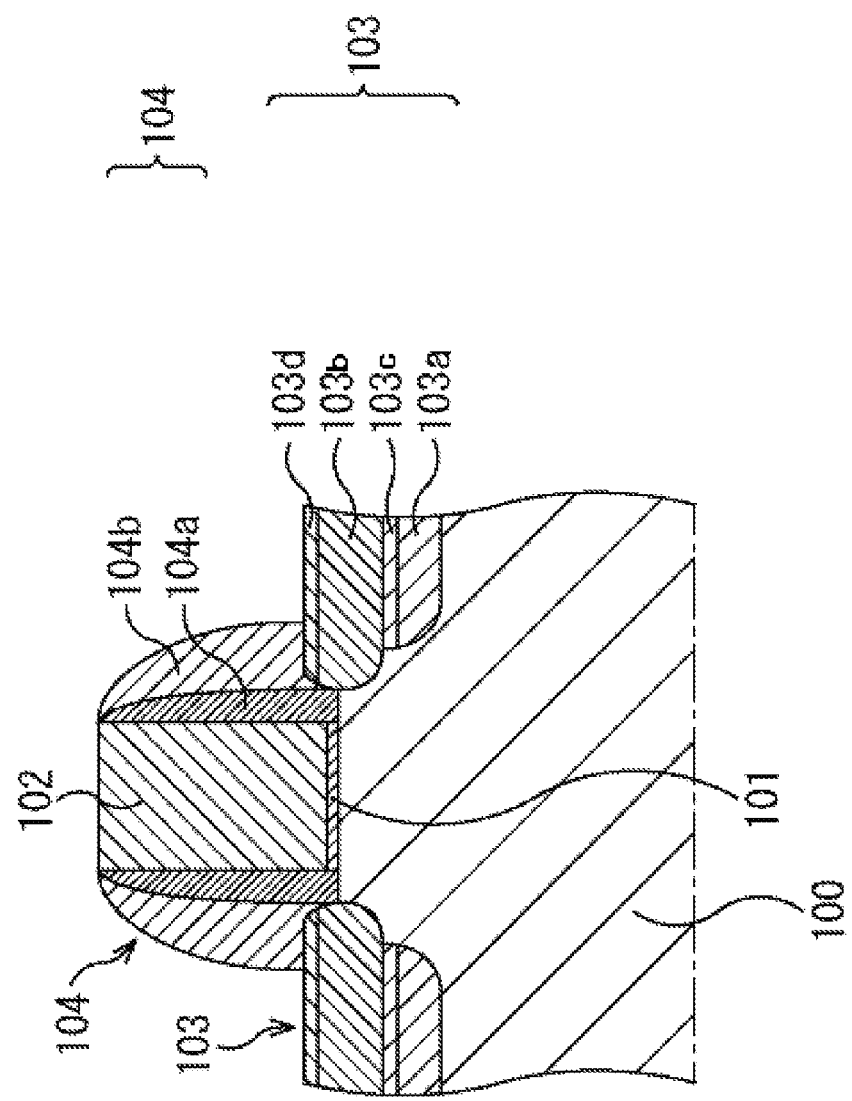
FIG. 1 is a sectional view showing a schematic configuration of a p-channel MOS transistor according to the present embodiment.

FIG. 1 is a sectional view showing a schematic configuration of the p-channel MOS transistor.

A gate electrode 102 is formed on a silicon substrate 100 via a gate insulating film 101. A semiconductor layer, for example, a SiGe layer 103, is formed by being embedded in a source/drain region located on both sides of the gate electrode 102. A side wall 104 is formed on the side surface of the gate electrode 102.

The SiGe layer 103 includes a first SiGe layer 103*a*, an intermediate layer 103*c* which is formed on the first SiGe layer 103*a* and which has a Ge composition ratio lower than that of a Si intermediate layer or of the first SiGe layer 103*a*, and a second SiGe layer 103*b* which is formed on the first SiGe layer 103*a* via the intermediate layer 103*c* and which has a Ge composition ratio higher than that of the first SiGe layer 103*a*. Further, the gate electrode 102 is more separated from an end portion of the first SiGe layer 103*a* than from an end portion of the second SiGe layer 103*b*.

Further, an upper layer 103*d* may be formed on the second SiGe layer 103*b*. The upper layer 103*d* is a Si layer or a SiGe layer. When the upper layer 103*d* is the SiGe layer, the Ge composition ratio is lower than that of the first SiGe layer 103*a*.

The side wall 104 includes a first side wall 104*a* which is formed on the side surface of the gate electrode 102, and a second side wall 104*b* which is formed on the first side wall 104*a*.

The first side wall 104*a* is formed of a tensile insulating film, in other words, this film is contracted by itself to compress the lattice of silicon under it, for example, SiN, and is formed so as to be in contact with the end portion of the second SiGe layer 103*b* (so that the gate electrode 102 and the second SiGe layer 103*b* are separated from each other via the first side wall 104*a*).

The second side wall 104*b* is formed of an insulating film, for example $SiO_2$, having a stress lower than that of the first side wall 104*a*, and is formed on the first side wall 104*a* and on a part of the second SiGe layer 103*b*.

Figure 2:
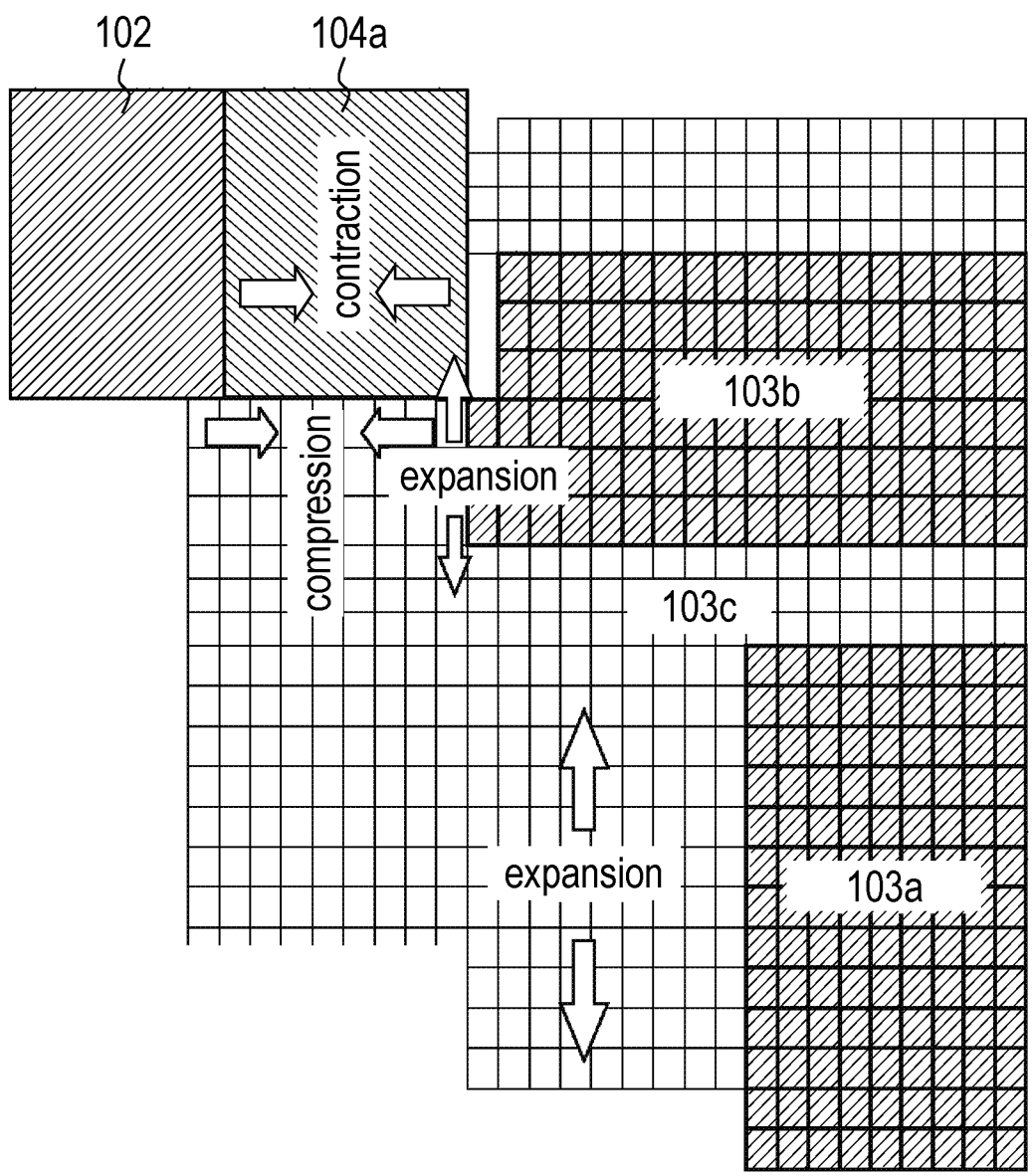
FIG. 2 is a schematic illustration for explaining stresses caused by a strain effect in the p-channel MOS transistor according to the present embodiment.

FIG. 2 is a schematic illustration for explaining stresses caused by a strain effect in the p-channel MOS transistor.

In the p-channel MOS transistor, the second SiGe layer 103*b* of the SiGe layer 103 is expanded by itself, so as to thereby expand the Silicon substrate under the gate electrode 102 and the first side wall 104*a* in the vertical direction (the strain is expansion). As a result, the Silicon substrate under the gate electrode 102 and the first side wall 104*a* is contracted in the channel length direction, so that a compressive strain (compression) is given in the channel length direction of the channel region and the region under the first side wall 104*a*. Here, in the second SiGe layer 103*b*, since it has a high Ge composition ratio, the resistance is lowered and the compressive strain is increased. However, since the second SiGe layer 103*b* is thinly formed at a shallow position, the transistor current is easily cut off, so that a sufficient roll-off characteristic is secured.

On the other hand, since the first SiGe layer 103*a* is thickly formed at a deep position, the first SiGe layer 103*a* significantly expands the lattice in the (110) plane which is the side surface of the channel region, and gives to the channel region a compressive strain in the channel length direction of the channel region. By this effect, the lack of compressive stress by the second SiGe layer 103*b* is compensated, and a large compressive strain can be given by the SiGe layer 103. In this case, the dislocation is not caused in the first SiGe layer 103*a* because of its low Ge composition ratio, and further the gate electrode 102 is more separated from the end portion of the first SiGe layer 103*a* than from the end portion of the second SiGe layer 103*b*. Therefore, there is no possibility that the roll-off characteristic is deteriorated.

Here, the first SiGe layer 103*a* is separated from the second SiGe layer 103*b* by the intermediate layer 103*c*, and hence the propagation of dislocation from the second SiGe layer 103*b* having the high Ge composition ratio to the first SiGe layer 103*a* is blocked by the intermediate layer 103*c*.

Further, the propagation of dislocation from the second SiGe layer 103*b* to the outside will be more surely prevented by forming the upper layer 103*d* on the second SiGe layer 103*b*.

Further, the first side wall 104*a* having the compressive property is formed on the side surface of the gate electrode 102, so as to thereby increase the compressive strain in the channel length direction of the channel region.

That is, when the first side wall 104*a* is provided in addition to the SiGe layer 103, a sufficiently large compressive strain, which is caused by summation of the compressive stresses of both the first side wall 104*a* and the SiGe layer 103, can be given in the channel length direction of the channel region.

Figure 3:
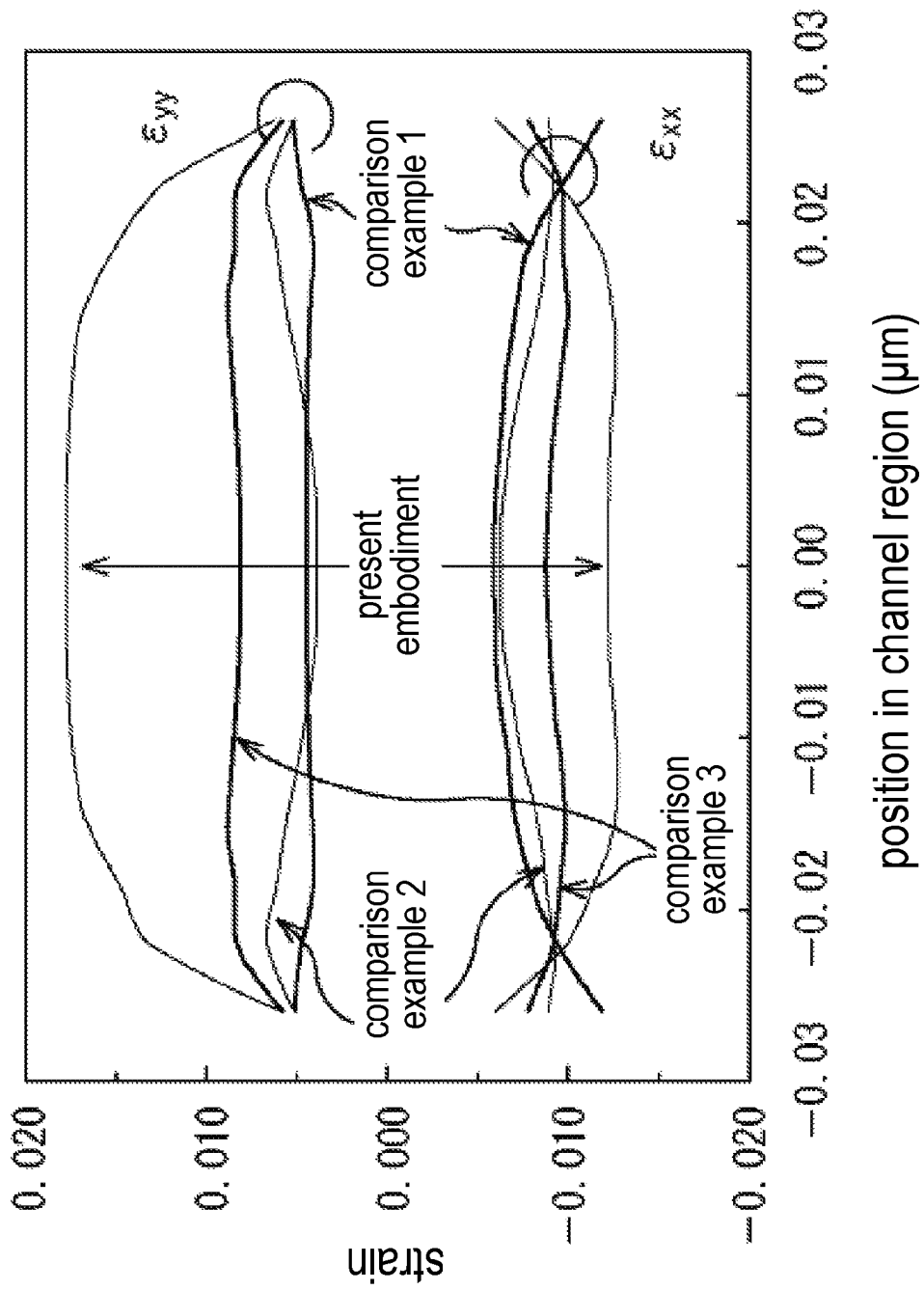
FIG. 3 is a characteristic diagram showing, in the p-channel MOS transistor according to the present embodiment, on the basis of a comparison with a conventional structure, lattice strain ($\epsilon_{xx}$ and $\epsilon_{yy}$) in the channel length direction and in the direction vertical to the channel direction in the case where the central portion of the channel region is set as an origin.

FIG. 3 is a characteristic diagram showing, in the p-channel MOS transistor according to the present embodiment, on the basis of a comparison with a conventional structure, strain components ($\epsilon_{xx}$ and $\epsilon_{yy}$) in the channel length direction and in the direction vertical to the channel length direction in the case where the central portion of the channel region is set as an origin. FIG. 4 shows stress values corresponding to FIG. 3.

In FIGS. 3 and 4, comparison example 1 shows an embedded structure having a conventional SiGe layer, comparison example 2 shows a structure in which an end of the SiGe layer is extended to an extension portion, and comparison example 3 shows a structure in which a side wall for applying a compressive strain is added to the structure of comparison example 2. Further, in FIG. 4, comparison examples 1 to 3 show stress values of structures in which a Si layer is formed instead of the SiGe layer. In the table, $\sigma_{LONG}$ represents the compressive stress in the channel length direction, $\sigma_{PERP}$ represents the compressive stress in the direction vertical to the channel length direction, and $\Delta\mu/\mu$ represents the mobility increasing Ratio on the basis of comparison example 3.

From FIGS. 3 and 4, it can be seen that in the present embodiment, the compressive stress (negative value) in the channel length direction and the tensile stress (positive value) in the direction vertical to the channel length direction are, respectively, significantly increased as compared with comparison examples 1 to 3. This means that the transistor characteristic of the p-channel MOS transistor is significantly improved.

Here, when the first SiGe layer 103*a* is assumed to be expressed as $Si_{1-x}Ge_x$, the Ge mole fraction x is set about in a range of $0.15 \leq x \leq 0.20$. When the Ge mole fraction is smaller than 0.15, the stress may be insufficient. When the Ge mole fraction is larger than 0.20, it may be that the dislocation is generated and that the roll-off characteristic is deteriorated. Therefore, a Ge mole fraction of about 0.15 or more and about 0.20 or less is preferred for a deep SiGe layer having a low Ge mole fraction.

The film thickness of the first SiGe layer 103*a* is set to about 25 nm to about 40 nm. When the film thickness is smaller than 25 nm, the stress may be insufficient. When the film thickness is larger than 40 nm, it may be that the dislocation is generated and that the roll-off characteristic is deteriorated. Therefore, a film thickness of about 25 nm or more and about 40 nm or less is preferred for the deep SiGe layer having the low Ge mole fraction.

When the intermediate layer 103*c* is assumed to be expressed as $Si_{1-x}Ge_x$, the Ge mole fraction x of the intermediate layer 103*c* is set about in a range of $0 \leq x \leq 0.10$. The intermediate layer 103*c* has an effect of suppressing a stacking fault from being induced in the first SiGe layer by being arranged as a SiGe layer having a Ge mole fraction lower than that of the first SiGe layer. Therefore, it is preferred that the Ge mole fraction of the intermediate layer 103c is set smaller than that of the first SiGe layer, and that the Ge mole fraction of the intermediate layer 103c is 0.10 or less.

The film thickness of the intermediate layer 103c is set to about 5 nm to about 10 nm.

When the second SiGe layer 103b is assumed to be expressed as $Si_{1-x}Ge_x$, the Ge mole fraction x of the second SiGe layer 103b is set about in a range of $0.20 < x \leq 0.30$. When the Ge mole fraction of the second SiGe layer 103b is larger than 0.30, the crystal defect penetration into SiGe may be caused. When the Ge mole fraction of the second SiGe layer 103b is smaller than 0.20, the effect of applying a larger stress to the channel may be significantly reduced.

The film thickness of the second SiGe layer 103b is set to about 10 nm to about 20 nm. When the film thickness of the second SiGe layer 103b is smaller than 10 nm, the effect of applying the stress is significantly reduced. When the film thickness of the second SiGe layer 103b is larger than 20 nm, the possibility of stacking fault penetration is increased because of the high Ge mole fraction of the layer. Therefore, a film thickness of about 10 nm or more and about 20 nm or less is preferred as the film thickness of the intermediate layer.

The upper layer 103d exhibits the same effect as that of the intermediate layer 103c. Also, when the upper layer 103d is assumed to be expressed as $Si_{1-x}Ge_x$, the Ge mole fraction x is preferably set in a range of $x \leq 0.10$ in order to suppress agglomeration at the time of silicide formation.

Further, as a semiconductor layer formed in the source/drain region, a SiGeC layer having a high Ge composition ratio may be formed instead of the first SiGe layer 103a.

In this case, when the SiGeC layer is expressed as $Si_{1-x-y}Ge_xC_y$, the Ge mole fraction x and the C mole fraction y are respectively set about in a range of $0.15 \leq x \leq 0.20$ and about in a range of $y \leq 0.01$. The film thickness of the SiGeC layer is set to 25 nm to 40 nm.

In the SiGeC layer, when the Ge mole fraction is smaller than 0.15, or when the film thickness is smaller than 25 nm, the stress may become insufficient. When the Ge mole fraction is larger than 0.20, or when the film thickness is larger than 40 nm, the dislocation may be generated. Further, when the C mole fraction is larger than 0.01, the stress may become insufficient. Therefore, the Ge mole fraction of about 0.15 or more and about 0.20 or less, the C mole fraction of about 0.01 or less, and the film thickness of about 25 nm or more and about 40 nm or less are preferred for the SiGeC layer which is provided in a deep region and which has a low Ge mole fraction.

Here, the second SiGe layer 103b may also be similarly formed as the SiGeC layer. In this case, when the SiGeC layer is expressed as $Si_{1-x-y}Ge_xC_y$, the Ge mole fraction x and the C mole fraction y are respectively set about in a range of $0.20 \leq x \leq 0.30$ and about in a range of $y \leq 0.01$. The film thickness of the SiGeC layer is set to 10 nm to 20 nm.

When the Ge mole fraction is larger than 0.30, or when the film thickness is larger than 20 nm, the stacking fault may be made to penetrate into the SiGeC layer. When the C mole fraction is larger than 0.01, the stress may become insufficient. On the other hand, when the film thickness is smaller than 10 nm, the stress may become insufficient. Therefore, the Ge mole fraction of 0.20 or more and 0.30 or less, the C mole fraction of 0.01 or less, and the film thickness of 10 nm to 20 nm are preferred for the SiGeC layer as the second SiGe layer.

The upper layer 103d has a function of preventing penetration of the stacking fault and dislocation into the lower layer 103b. Thus, when the upper layer 103d is assumed to be expressed as $Si_{1-x-y}Ge_xC_y$, it is preferred that the Ge mole fraction x and the C mole fraction y are respectively set in a range of $x \leq 0.10$ and in a range of $y < 0.01$, and that the film thickness of the layer is set to 15 nm to 20 nm.

As described above, in the above described p-channel MOS transistor, the operating speed can be increased by significantly improving the current drive capability in such a manner that the strain amount to the channel region is increased while the transistor roll-off characteristic is sufficiently secured by suppressing the generation of dislocation in the SiGe layer 103.

In the above, the p-channel MOS transistor is described. However, in the case of an n-channel MOS transistor, SiC layer is formed instead of the SiGe layer 103. That is, a first SiC layer similar to the first SiGe layer 103a is formed, and a second SiC layer similar to the second SiGe layer 103b is formed. Further, instead of the intermediate layer 103c and the upper layer 103d, an intermediate layer and an upper layer, which include Si or SiC, are formed similarly to the intermediate layer 103c and the upper layer 103d. Further, instead of the first side wall 104a, a first side wall includes an expansible insulating film (SiN or the like) formed similarly to the first side wall 104a.

Here, when the first SiC layer is assumed to be expressed as $Si_{1-y}C_y$, the C mole fraction y is set about in a range of $0.008 \leq y \leq 0.012$. When the C mole fraction is smaller than 0.008, the stress may become insufficient. When the C mole fraction is larger than 0.012, dislocation may be generated. Therefore, the C mole fraction of about 0.008 or more and about 0.012 or less is preferred for the deep SiC layer having the low C mole fraction.

The film thickness of the first SiC layer is set from about 25 nm to about 40 nm. When the film thickness is smaller than 25 nm, the stress may become insufficient. When the film thickness is larger than 40 nm, the dislocation may be generated. Therefore, the film thickness from about 25 nm or more and about 40 nm or less is preferred for the deep SiC layer having the low C mole fraction.

When the second SiC layer is assumed to be expressed as $Si_{1-y}C_y$, the C mole fraction y is set in a range of $y \leq 0.005$. When the C mole fraction is larger than 0.005, the dislocation may be generated. Also, the role of the second SiC layer is to prevent penetration of a defect into the lower SiC layer. Therefore, the C mole fraction of about 0.005 or less is preferred for the second SiC layer. Alternatively, the second SiC layer may be formed as a complete silicon layer.

The film thickness of the second SiC layer is set from about 5 nm to about 10 nm. Since the overall depth of the recess is 50 nm, when the film thickness of the second SiC layer is smaller than 5 nm, the defect penetration preventing capability to the lower SiC layer is reduced. When the film thickness of the second SiC layer is larger than 10 nm, the SiC layer for applying the main stress cannot be embedded, as will be described below. Therefore, the film thickness of about 5 nm or more and about 10 nm or less is preferred for a shallow SiC layer having the high C mole fraction.

When the intermediate layer is assumed to be expressed as $Si_{1-y}C_y$, the C mole fraction y is set about in a range of $0.015 < y \leq 0.025$. When the C mole fraction is larger than 0.025, the defect penetration into SiC may not be prevented, and C may be precipitated at an inter-lattice position from a lattice position by heat treatment after formation of SiC. Therefore, the C mole fraction of about 0.015 or more and about 0.025 or less is preferred for the intermediate layer.

The film thickness of the intermediate layer is set from 10 nm to 20 nm. When the film thickness is smaller than 10 nm, the stress application capability may become insufficient. When the film thickness is larger than 20 nm, crystal defect penetration may be caused. Therefore, the film thickness of about 10 nm or more and about 20 nm or less is preferred for the intermediate layer.

The upper layer 103d has a function of preventing penetration of the stacking fault and dislocation into the lower layer 103b. Thus, when the upper layer 103d is assumed to be expressed as $Si_{1-y}C_y$, it is preferred that the C mole fraction y is set in a range of y<0.005, and that the film thickness is set from about 15 nm to about 20 nm.

Further, as a semiconductor layer formed in the source/drain region, a SiGeC layer may be formed instead of the first SiC layer.

In this case, in the SiGeC layer represented as $Si_{1-x}Ge_xC_y$, the Ge mole fraction x and the C mole fraction y are respectively set about in a range of x≤0.01 and about in a range of 0.008<y≤0.015. The film thickness is set from about 25 nm to about 40 nm.

In the SiGeC layer, when the C mole fraction is smaller than 0.008, or when the film thickness is less than 25 nm, the stress becomes insufficient. Also, when the Ge mole fraction is larger than 0.01, the lattice contraction effect resulting from the introduction of C is offset by Ge, so that the application amount of stress is reduced. Therefore, the C mole fraction of about 0.008 or more and about 0.015 or less, the Ge mole fraction of about 0.01 or less, and the film thickness of about 25 nm or more and about 40 nm or less are preferred for the shallow SiGeC layer having the high C mole fraction.

Here, the intermediate layer may also be similarly formed by a SiGeC layer. In this case, when the SiGeC layer is expressed as $Si_{1-x}Ge_xC_y$, the Ge mole fraction x and the C mole fraction y are respectively set about in a range of x≤0.01 and about in a range of 0.015≤y≤0.025. The film thickness is set from 10 nm to 20 nm.

When the C mole fraction is larger than 0.025, or when the film thickness is larger than 20 nm, the defect penetration in SiC may not be prevented and C may be precipitated at an inter-lattice position from a lattice position by heat treatment after formation of SiC. When the Ge mole fraction is larger than 0.01, the lattice contraction effect resulting from the introduction of C is offset by Ge, so that the application amount of stress is reduced. Therefore, the C mole fraction of about 0.015 or more and about 0.025 or less, the Ge mole fraction of about 0.01 or less, and the film thickness of about 10 nm or more and about 20 nm or less are preferred for the SiGeC layer as the intermediate layer 103c.

The upper layer 103d has a function of preventing penetration of the stacking fault and dislocation into the lower layer 103b. Thus, when the upper layer 103d is assumed to be expressed as $Si_{1-x-y}Ge_xC_y$, it is preferred that the Ge mole fraction x and the C mole fraction y are respectively set in a range of x<0.01 and in a range of y<0.005, and that the film thickness is set from 15 nm to 20 nm.

In the above described n-channel MOS transistor, the operating speed can be increased by significantly improving the current drive capability in such a manner that the strain amount to the channel region is increased while the transistor roll-off characteristic is sufficiently secured by suppressing the generation of dislocation in the SiC layer.

In the following, there will be described a manufacturing method of a CMOS transistor according to the present embodiment. Note that in the following embodiments, a CMOS transistor including an n-channel MOS transistor and a p-channel MOS transistor will be exemplified as a semiconductor device. However, the present invention is not limited to this and is applicable to other semiconductor devices having a gate electrode.

Figure 5A:
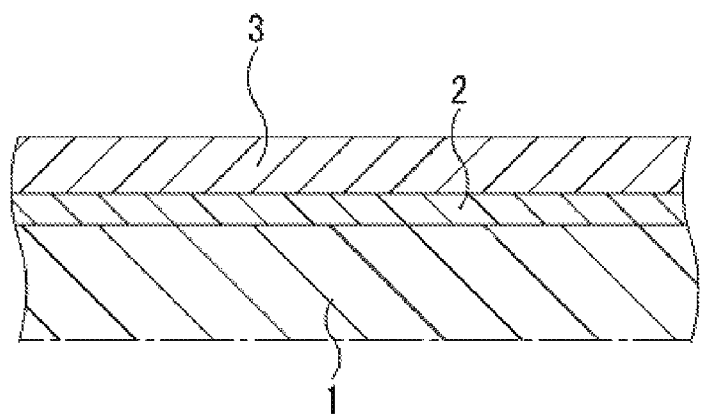
FIGS. 5A to 5W are schematic cross sectional views showing a manufacturing method of a CMOS transistor according to the present embodiment.

First, as shown in FIG. 5A, a silicon oxide film 2 and a silicon nitride film 3 are successively formed on a silicon substrate 1.

More particularly, the silicon oxide film 2 having a film thickness of, for example, about 10 nm is first formed on the silicon substrate 1, for example, by a dry oxidation method at 900° C.

Next, the silicon nitride film 3 having a film thickness of, for example, about 112 nm is formed on the silicon oxide film 2, for example, by a chemical vapor deposition (CVD) method using, for example, a mixed gas of $SiH_2Cl_2$ and $NH_3$ at a temperature of 750° C.

Figure 5B:
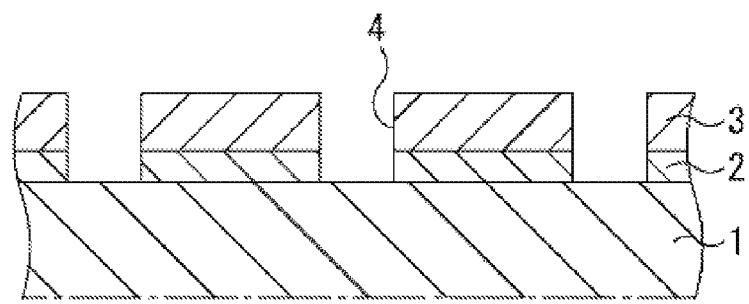

Subsequently, openings 4 are formed in the silicon nitride film 3 and the silicon oxide film 2 as shown in FIG. 5B.

More particularly, portions of the silicon nitride film 3 and the silicon oxide film 2 which correspond to portions on element isolation regions of the silicon substrate 1 are processed by lithography and dry etching, so that the openings 4 are formed in the silicon nitride film 3 and the silicon oxide film 2.

Figure 5C:
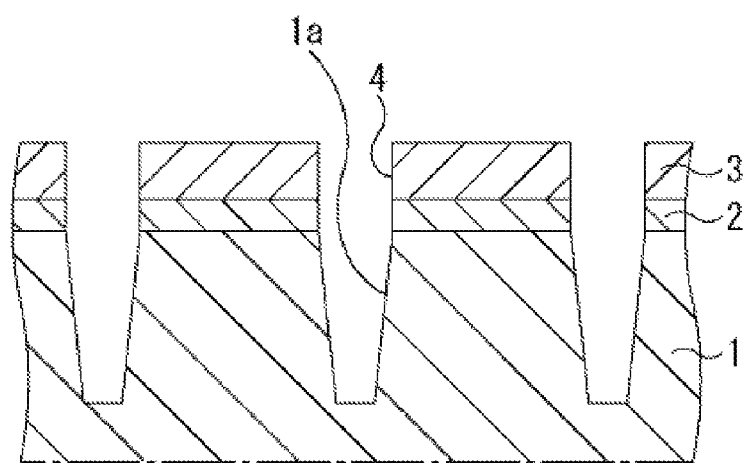

Subsequently, as shown in FIG. 5C, isolation trenches 1a are formed in the silicon substrate 1.

More particularly, the silicon substrate 1 is dry etched by using, as a mask, the silicon oxide film 2 and the silicon nitride film 3 in which the openings 4 are formed. Thereby, the isolation trenches 1a are formed in the portions exposed by the openings 4 on the silicon substrate 1.

Figure 5D:
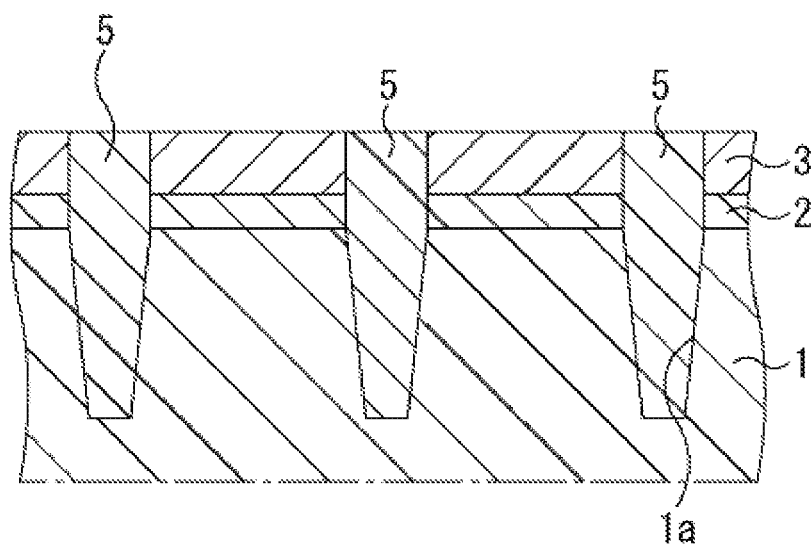

Subsequently, as shown in FIG. 5D, a silicon oxide film 5 is deposited so as to be embedded into the openings 4 and the isolation trenches 1a.

More particularly, the silicon oxide film 5 as an insulating material is deposited, here for example, by a plasma CVD method, so as to be embedded into the portions in the openings 4 and the isolation trenches 1a, which are exposed from the openings 4.

Figure 5E:
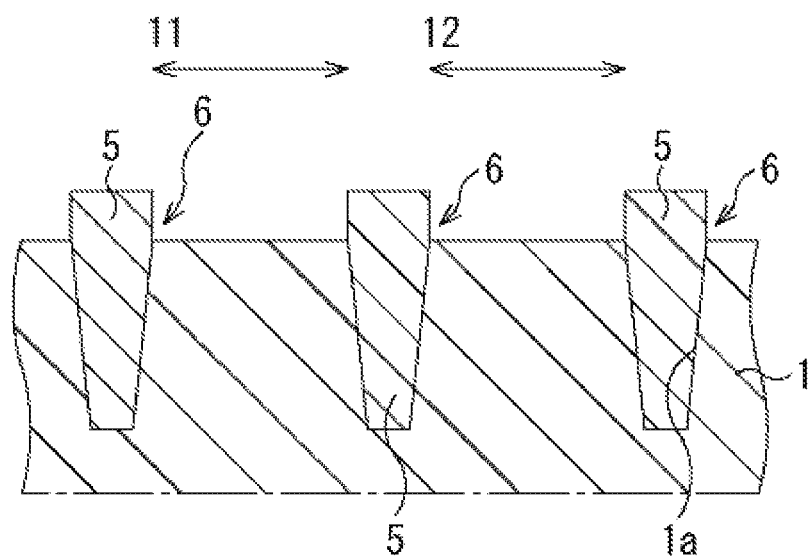

Subsequently, STI element isolation structures 6 are formed as shown in FIG. 5E.

More particularly, the silicon oxide film 5 is ground and flattened by chemical mechanical polishing (CMP) until the surface of the silicon nitride film 3 is exposed. Thereafter, the silicon oxide film 5 is removed by wet etching, and the exposed silicon oxide film 2 is further removed by wet etching using hydrofluoric acid.

Thereby, there are formed shallow trench isolation (STI) element isolation structures 6 which define active regions, here, an n-MOS region 11 and a p-MOS region 12 on the silicon substrate 1.

Figure 5F:
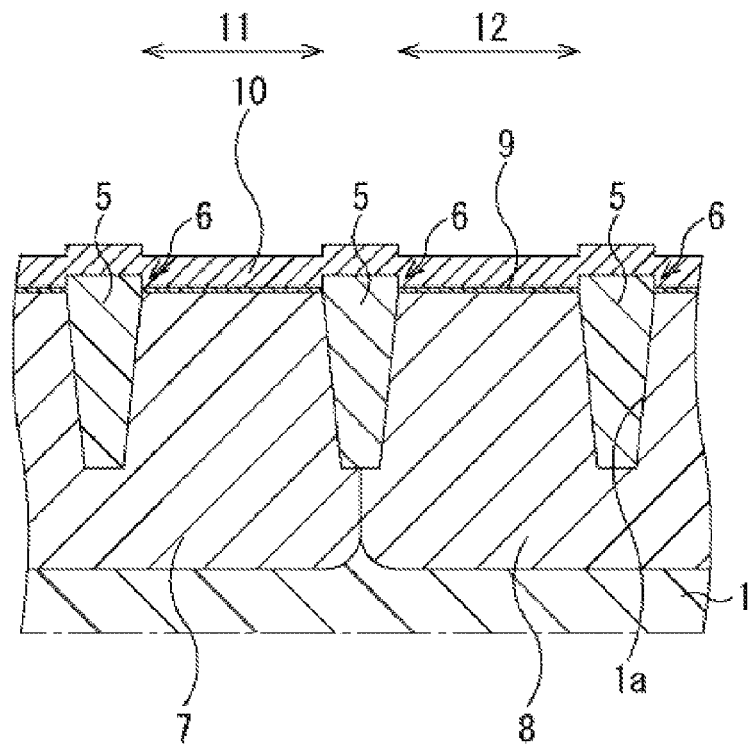

Subsequently, as shown in FIG. 5F, a p-well 7, an n-well 8, a gate insulating film 9, and a polycrystalline silicon film 10 are formed, respectively.

More particularly, a resist mask (not shown) covering the p-MOS region 12 is first formed. By using the resist mask, a p-type impurity, here boron ($B^+$), is ion-planted only into the n-MOS region 11 under the condition of an acceleration energy of 100 keV and a dose amount of $1\times10^{13}/cm^2$.

Next, after the resist mask is removed by ashing treatment and the like, a resist mask (not shown) covering the n-MOS region 11 is formed. By using the resist mask, an n-type impurity, here phosphorus ($P^+$), is ion-planted only into the p-MOS region 12 under the condition of an acceleration energy of 150 keV and a dose amount of $1\times10^{13}/cm^2$.

Next, after the resist mask is removed by the ashing treatment and the like, activating annealing is performed. Thereby, the p-well 7 is formed in the n-MOS region 11, and the n-well 8 is formed in the p-MOS region 12, in such a manner that the p-well 7 and the n-well 8 surround a part of the STI element isolation structure 6.

Next, the gate insulating film 9, which includes a silicon oxide film and which has a thickness of, for example, about 1.5 nm, is formed by dry-oxidizing the surface of the n-MOS region 11 and the surface of the p-MOS region 12.

Next, on the gate insulating film 9, the polycrystalline silicon film 10 is deposited in a film thickness of, for example, about 100 nm by a CVD method or the like.

Figure 5G:
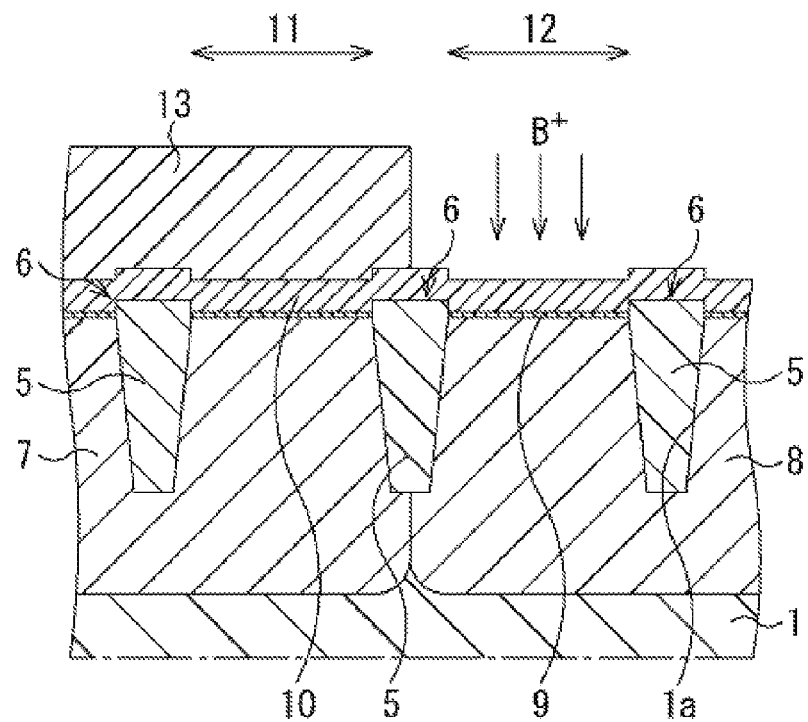

Subsequently, as shown in FIG. 5G, a p-type impurity is introduced into the portion of the polycrystalline silicon film 10, which corresponds to the p-MOS region 12.

More particularly, a resist mask 13 covering the n-MOS region 11 is formed. By using the resist mask 13, the p-type impurity, here boron ($B^+$), is ion-planted only into the portion of the polycrystalline silicon film 10, which corresponds to the p-MOS region 12, under the condition of an acceleration energy of 6 keV and a dose amount of $6 \times 10^{15}/cm^2$. Thereafter, the resist mask 13 is removed by the ashing treatment and the like.

Figure 5H:
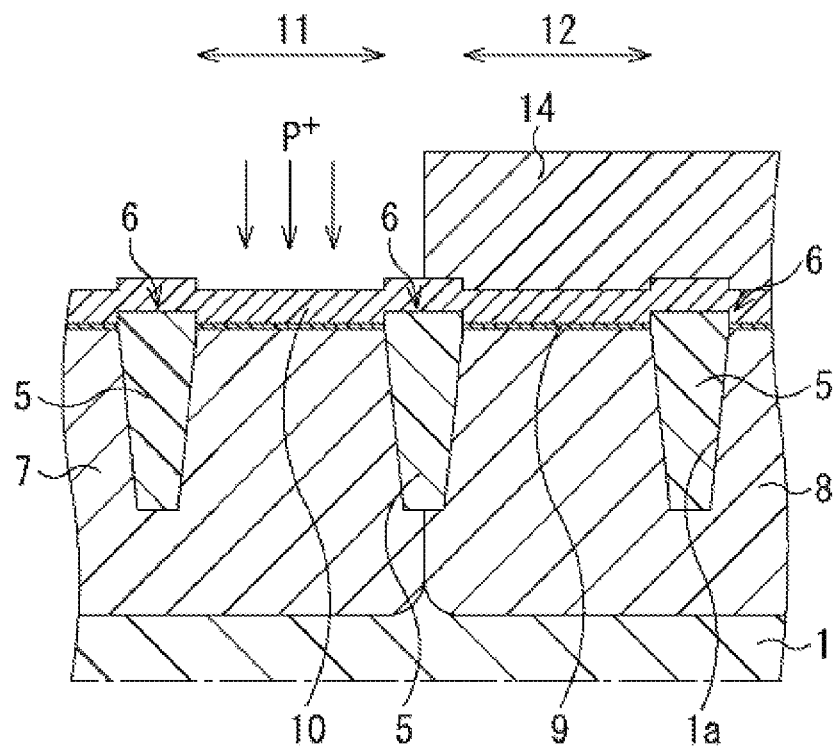

Subsequently, as shown in FIG. 5H, an n-type impurity is introduced into the portion of the polycrystalline silicon film 10, which corresponds to the n-MOS region 11.

More particularly, a resist mask 14 covering the p-MOS region 12 is formed. By using the resist mask 14, the n-type impurity, here phosphorus ($P^+$), is ion-planted into the portion of the polycrystalline silicon film 10, which corresponds to the n-MOS region 11, under the condition of an acceleration energy of 8 keV and a dose amount of $8 \times 10^{15}/cm^2$. Thereafter, the resist mask 14 is removed by the ashing treatment and the like.

Figure 5I:
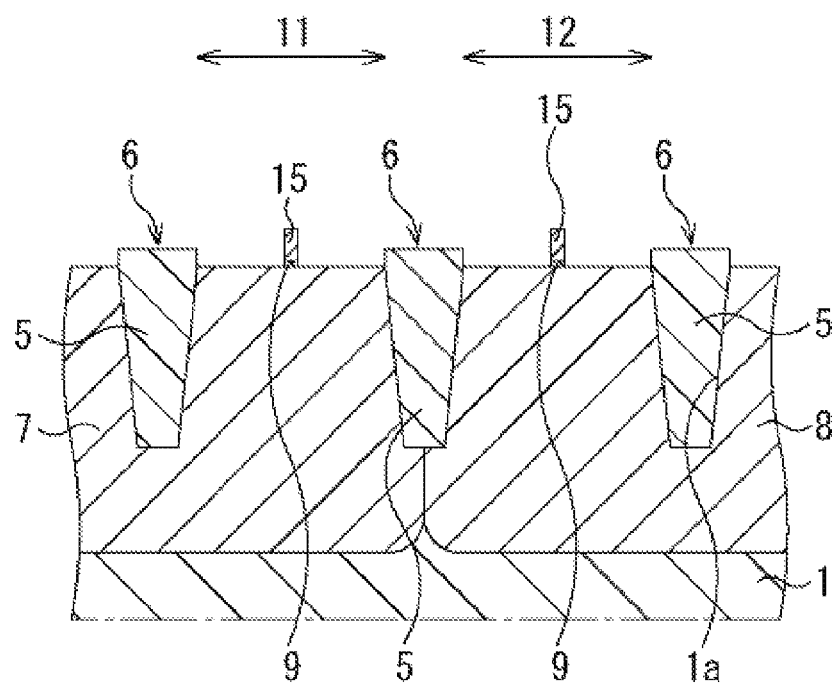

Subsequently, as shown in FIG. 5I, gate electrodes 15 are formed.

More particularly, the polycrystalline silicon film 10 and the gate insulating film 9 are processed by lithography and dry etching. Thereby, in the n-MOS region 11 and the p-MOS region 12, the gate electrodes 15 are formed on the silicon substrate 1 via the gate insulating film 9.

Figure 5J:
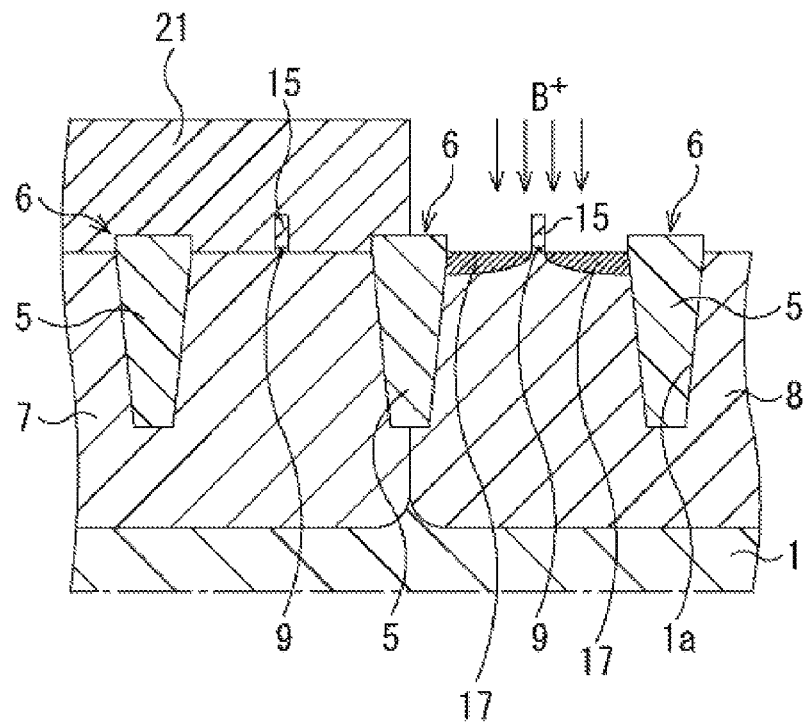

Subsequently, as shown in FIG. 5J, a p-extension region 17 and a pocket region are successively formed in the p-MOS region 12.

More particularly, a resist mask 21 covering the n-MOS region 11 is formed. By using the resist mask 21, the p-type impurity, here boron ($B^+$), is ion-planted into the p-MOS region 12 under the condition of an acceleration energy of 0.5 keV and a dose amount of $1 \times 10^{15}/cm^2$. Thereby, in the p-MOS region 12, the p-extension region 17 is formed on both sides of the gate electrode 15 on the surface layer of the silicon substrate 1.

Next, in order to form the pocket region (not shown), an n-type impurity, here arsenic ($As^+$), is ion-implanted into the p-MOS region 12 by using the resist mask 21 under the condition of an acceleration energy of 10 keV and a dose amount of $2 \times 10^{13}/cm^2$.

Thereafter, the resist mask 21 is removed by the ashing treatment and the like.

Figure 5K:
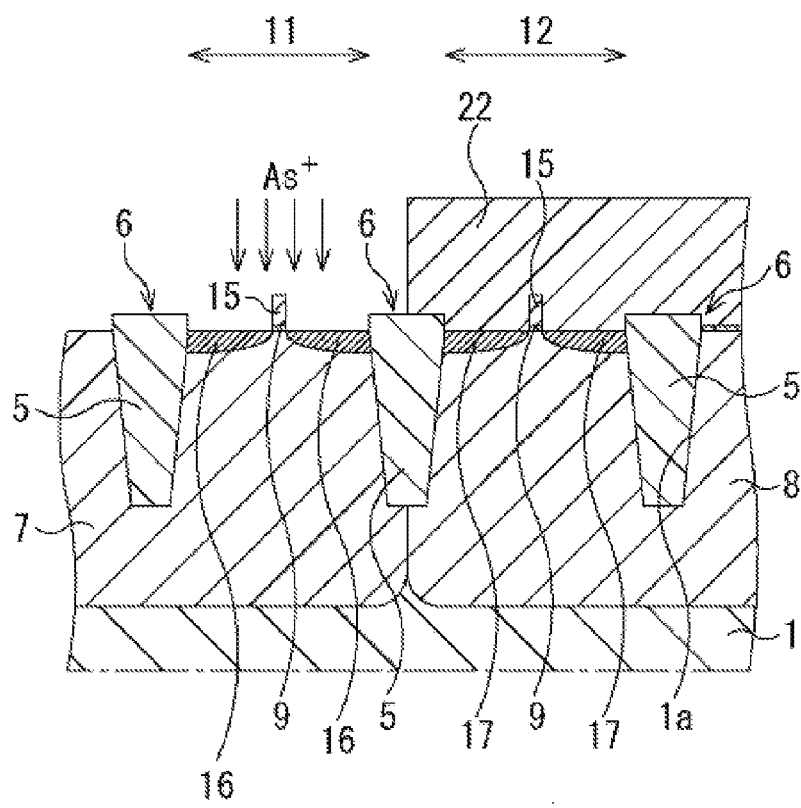

Subsequently, as shown in FIG. 5K, an n-extension region 16 and a pocket region are successively formed in the n-MOS region 11.

More particularly, a resist mask 22 covering the p-MOS region 12 is formed. By using the resist mask 22, the n-type impurity, here arsenic ($As^+$), is ion-planted into the n-MOS region 11 under the condition of an acceleration energy of 3 keV and a dose amount of $1 \times 10^{15}/cm^2$. Thereby, in the n-MOS region 11, the n-extension region 16 is formed on both sides of the gate electrode 15 on the surface layer of the silicon substrate 1.

Next, in order to form the pocket region (not shown), the p-type impurity, here boron ($B^+$), is ion-implanted into the n-MOS region 11 by using the resist mask 22 under the condition of an acceleration energy of 10 keV and a dose amount of $1 \times 10^{13}/cm^2$.

Thereafter, the resist mask 22 is removed by the ashing treatment and the like.

Note that in the above described passages regarding each ion implantation, the impurities are activated by the annealing treatment as will be described below, so that each of the extension regions 16 and 17 (and each of the pocket regions) are formed. However, in the figure, for the sake of convenience, the regions are represented as the extension regions 16 and 17.

Figure 5L:
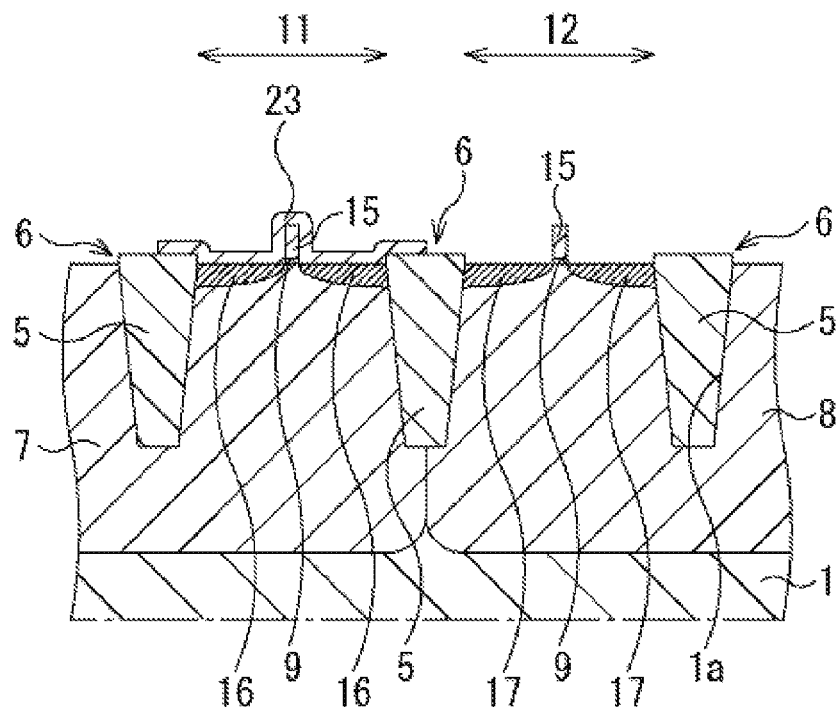

Subsequently, as shown in FIG. 5L, an oxide film mask 23 covering the n-MOS region 11 is formed. More particularly, a silicon oxide film (not shown) is deposited in a film thickness of about 30 nm on the whole surface of the silicon substrate 1 by a CVD method, or the like, at a low temperature (of about 400° C. to about 550° C.). Then, the silicon oxide film is processed by lithography and dry etching. Thereby, there is formed the oxide film mask 23 which covers the n-MOS region 11 and which exposes the p-MOS region 12.

Figure 5M:
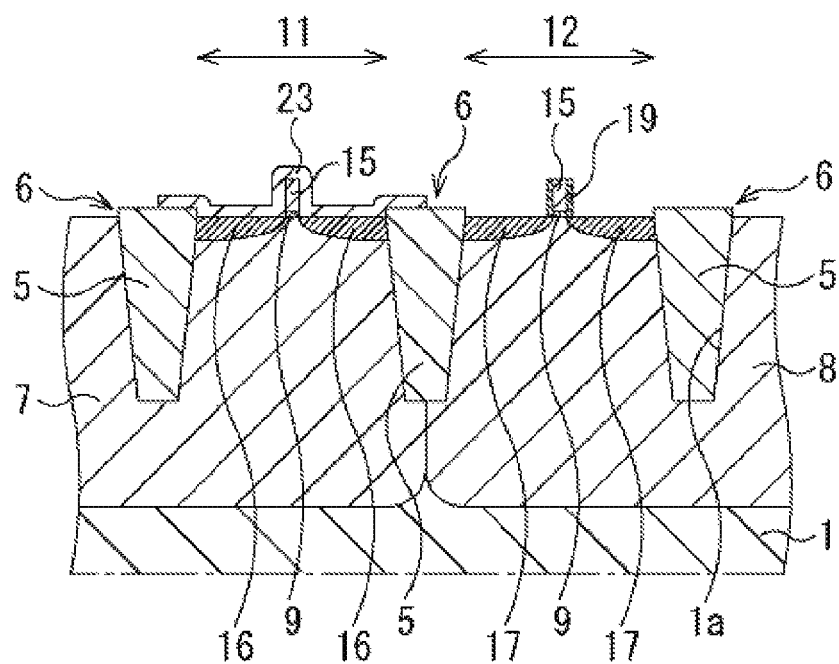

Subsequently, as shown in FIG. 5M, a first side wall 19 is formed on the side surface of the gate electrode 15 in the p-MOS region 12.

More particularly, a tensile film, that compress the lattice spacing of silicon under it, here a silicon nitride film (not shown), is first formed on the whole surface of the silicon substrate 1. Specifically, the tensile silicon nitride film is formed in a film thickness of, for example, about 10 nm by a reduced pressure CVD method using a mixed gas of $SiH_4$ and $NH_3$ at a treatment temperature of 600 to 650° C.

Next, a resist mask (not shown) covering the n-MOS region 11 on the silicon nitride film is formed. Then, the whole surface of the silicon nitride film, which surface is exposed in the p-MOS region 12, is subjected to anisotropic dry etching (etched back), so that the silicon nitride film is left on the side surface of the gate electrode 15. Thereby, the first side wall 19 is formed on the side surface of the gate electrode 15 in the p-MOS region 12.

Thereafter, the resist mask is removed by the ashing treatment and the like.

Figure 5N:
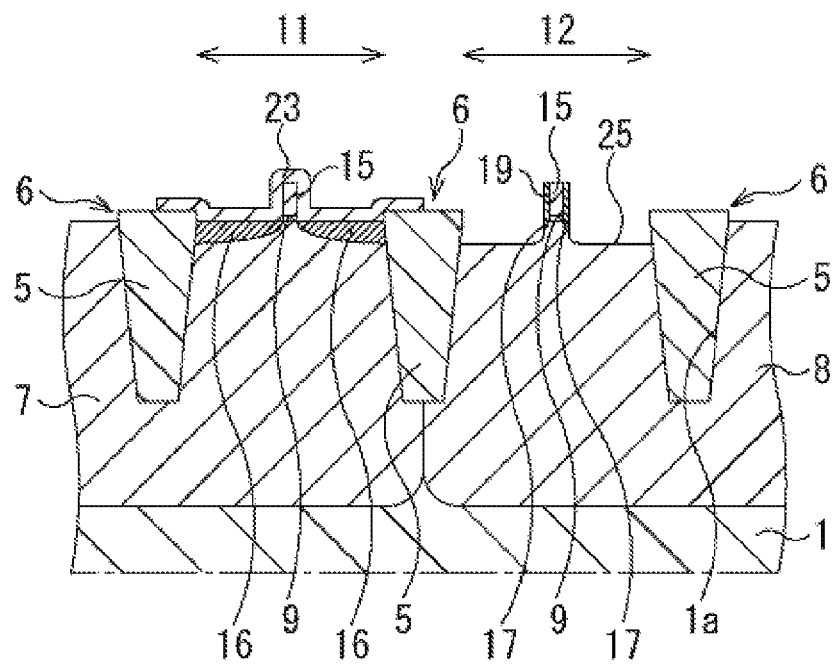
Figure 6A:
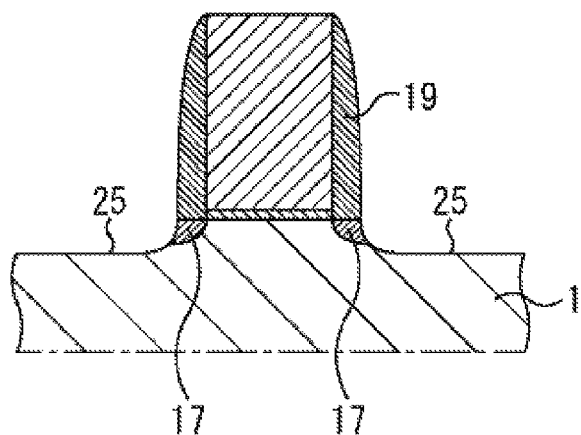
FIGS. 6A to 6I are enlarged schematic cross sectional views showing states in the vicinity of the gate electrode of the p-channel MOS transistor in the main processes in FIGS. 5A to 5W.

Subsequently, as shown in FIGS. 5N and 6A, a shallow recessed portion 25 is formed in the p-MOS region 12.

More particularly, the surface of the silicon substrate 1 in the p-MOS region 12 is dry etched to a depth of, for example, about 10 nm. At this time, in the p-MOS region 12, the gate electrode 15 and the side wall 19 serve as a mask, so that the shallow recessed portion 25 is formed on the surface of the silicon substrate 1.

Figure 5O:
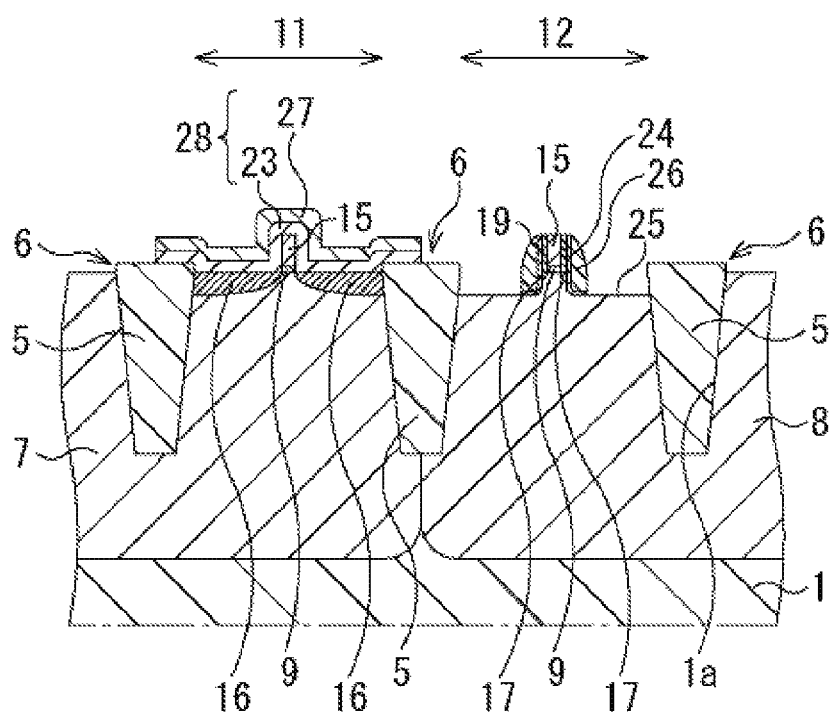
Figure 6B:
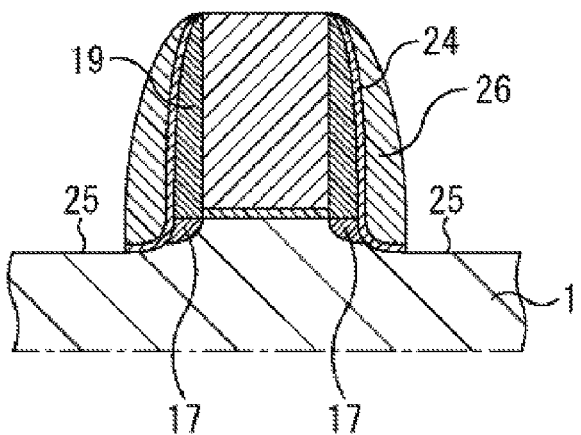

Subsequently, as shown in FIGS. 5O and 6B, a side wall 26 is formed on the side surface of the gate electrode 15 and on an end portion of the recessed portion 25 in the p-MOS region 12.

More particularly, a thin silicon oxide film 24 is first formed, for example by a CVD method, on the surface of the silicon substrate 1 in the p-MOS region 12, which surface is exposed from the oxide film mask 23.

Next, a silicon nitride film (not shown) is formed in a film thickness of, for example, about 20 nm on the whole surface of the silicon substrate 1 by a plasma CVD method at a treatment temperature of 500° C. or more and less than 600° C.

Next, a resist mask (not shown) covering the n-MOS region 11 on the silicon nitride film is formed. Then, the whole surface of the silicon nitride film, which surface is exposed in the p-MOS region 12, is subjected to anisotropic dry etching (etched back), so that the silicon nitride film is left on the side surface of the gate electrode 15 in the p-MOS region 12 which is exposed from the oxide film mask 23.

Thereby, in the p-MOS region 12, the side wall 26 is formed on the side surface of the gate electrode 15 via the first side wall 19 and the silicon oxide film 24, and formed at the end portion of the recessed portion 25. Along with the formation of the side wall 26, the silicon oxide film 24 is removed except the portion formed under the side wall 26.

Thereafter, the resist mask formed in the n-MOS region 11 is removed by the ashing treatment and the like. At this time, the silicon nitride film is left in the n-MOS region 11, so that a nitride film mask 27 (including the silicon nitride film at the time when the first side wall 19 is formed) is formed on the oxide film mask 23. Hereinafter, a laminated body of the oxide film mask 23 and the nitride film mask 27 is referred to as a laminated mask 28.

Figure 5P:
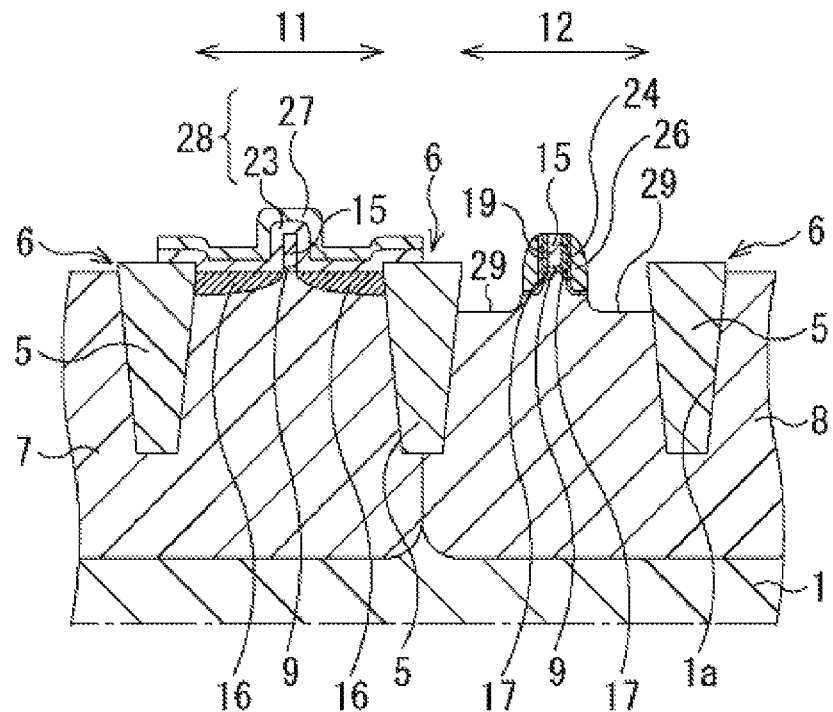
Figure 6C:
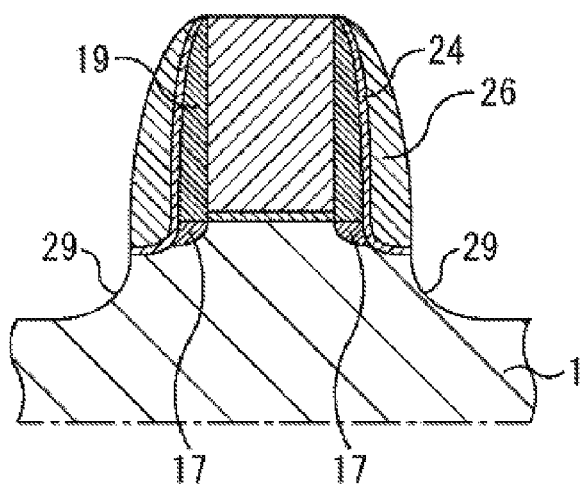

Subsequently, as shown in FIGS. 5P and 6C, a deep recessed portion 29 is formed in the p-MOS region 12.

More particularly, the surface of the silicon substrate 1 in the p-MOS region 12 is dry etched to a depth of, for example, about 30 nm. At this time, in the p-MOS region 12, the gate electrode 15, the first side wall 19, the silicon oxide film 24, and the side wall 26 serve as a mask, so that the bottom surface of the recessed portion 25 is etched. Thereby, the deep recessed portion 29 is formed.

Thereafter, the inner wall surface of the recessed portion 29 is wet etched in a depth of about 10 nm by using, for example, an alkali acid (tetra-methyl ammonium hydroxide (TMAH)) for smooth processing of the inner wall surface of the recessed portion 29. Thereby, the depth of the recessed portion 29 is set to about 40 nm on the basis of the surface of the silicon substrate 1.

Figure 5Q:
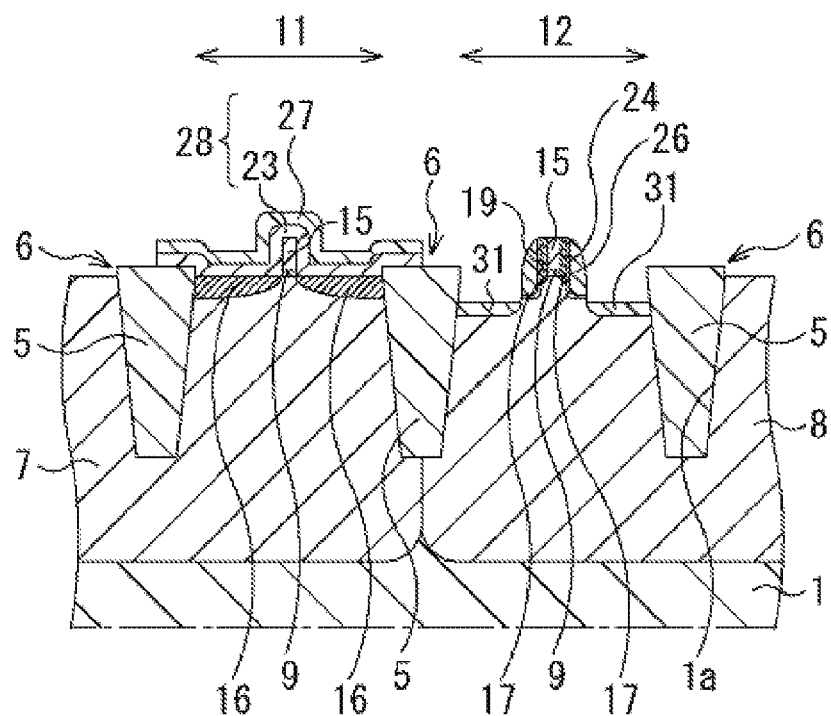
Figure 6D:
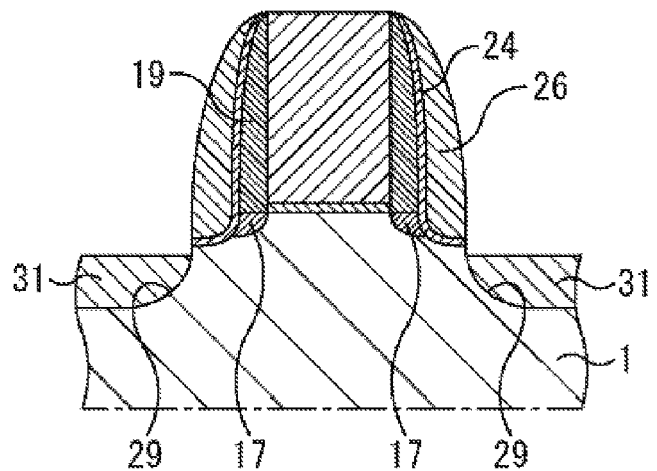

Subsequently, as shown in FIGS. 5Q and 6D, there is formed a first SiGe layer 31, which is embedded to a predetermined depth in the recessed portion 29.

More particularly, SiGe which is specifically expressed as $Si_{1-x}Ge_x$ where x is set as, for example, $0.15 \leq x \leq 0.20$, and which is here expressed as $Si_{0.80}Ge_{0.20}$ (x=0.20: Ge mole fraction of 0.20), is selectively grown in the recessed portion 29 in which the silicon surface is exposed, by a selective epitaxial growth method using a mixed gas of $SiH_4$, $B_2H_6$, $GeH_4$, $H_2$ and HCl as source gas at a growth temperature of 600° C. or less. Thereby, the first SiGe layer 31 is formed in the recessed portion 29 at the predetermined depth. The first SiGe layer 31 is set to be formed to such an extent that the first SiGe layer 31 and an intermediate Si layer as will be described below are embedded together in the recessed portion 29. The film thickness of the first SiGe layer 31 is set to, for example, about 30 nm. At this time, a doping amount of boron (B) into the first SiGe layer 31 is, for example, about 1 mΩ·cm expressed in terms of resistivity.

Figure 5R:
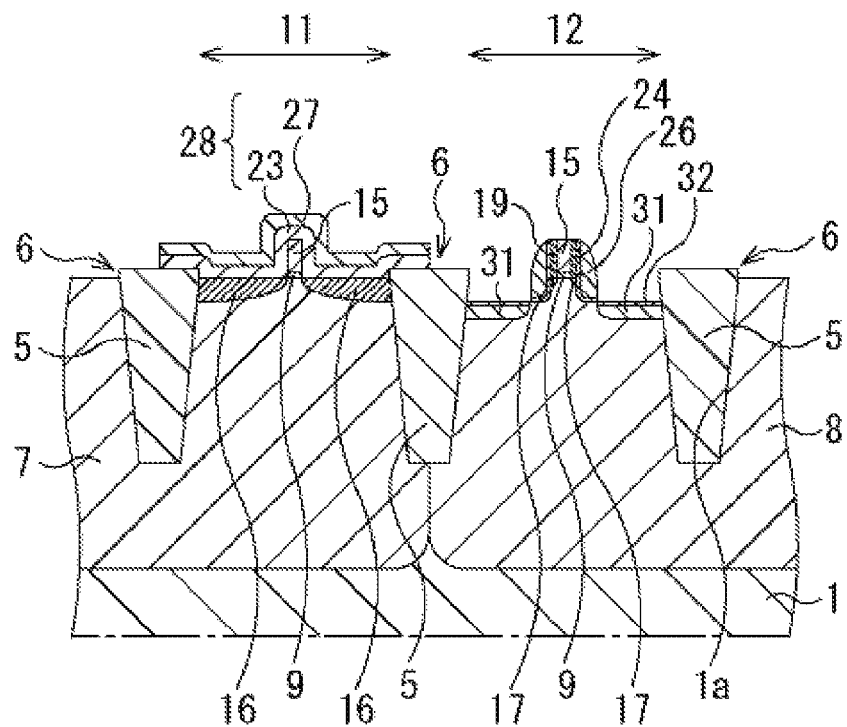
Figure 6E:
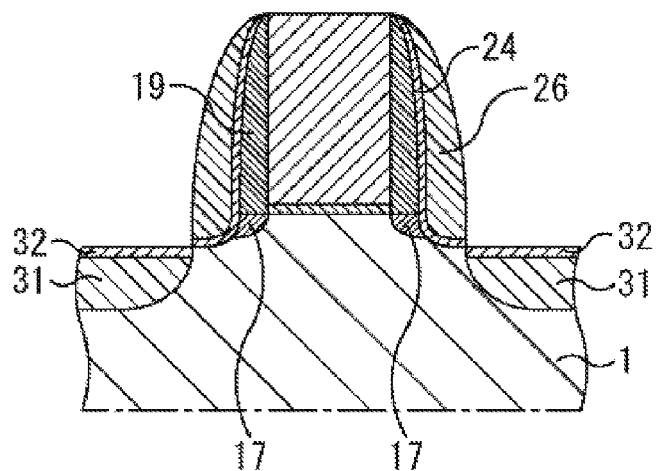

Subsequently, as shown in FIGS. 5R and 6E, an intermediate Si layer 32 is formed on the first SiGe layer 31.

More particularly, Si is selectively grown on the first SiGe layer 31 by a selective epitaxial growth method using a mixed gas of $SiH_4$, $B_2H_6$ and HCl as source gas, at a growth temperature of 600° C. or less. Thereby, the intermediate Si layer 32 is formed. The intermediate Si layer 32 is set to be formed to such an extent that the first SiGe layer 31 and the intermediate Si layer 32 are embedded together into the recessed portion 29. The film thickness of the intermediate Si layer 32 is set to about 10 nm.

Figure 5S:
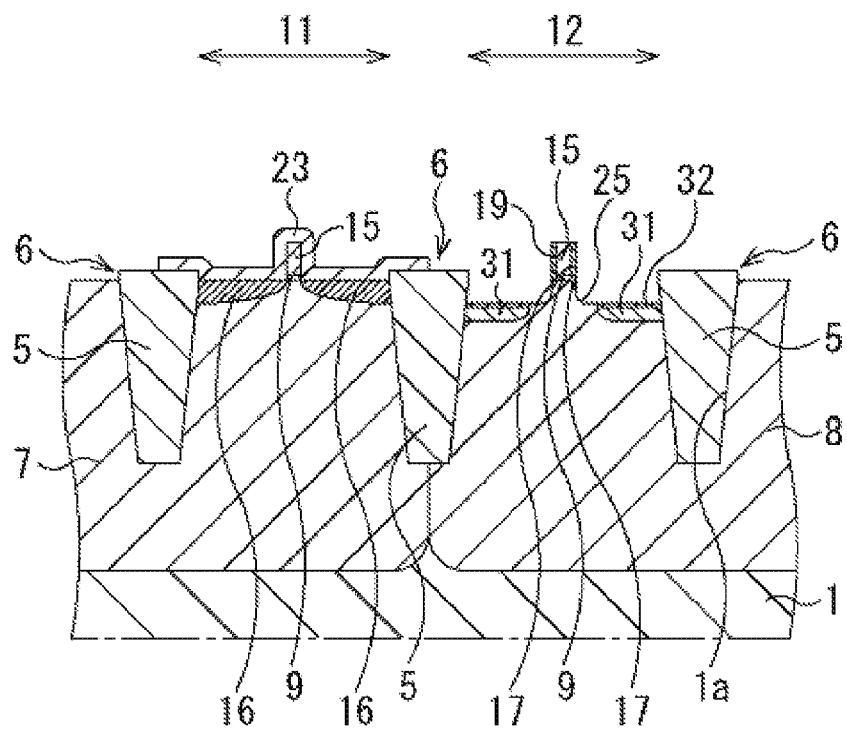
Figure 6F:
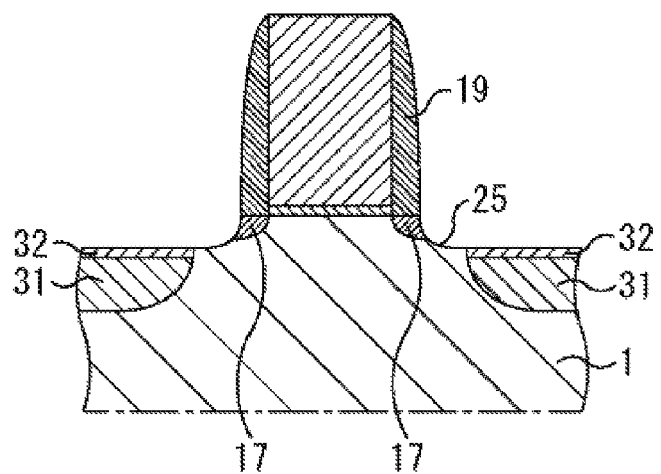

Subsequently, as shown in FIGS. 5S and 6F, the side wall 26 is removed.

More particularly, the side wall 26 in the p-MOS region 12 is removed by chemical dry etching. At this time, in the n-MOS region 11, the nitride film mask 27 of the laminated mask 28 is also simultaneously removed. Thereby, a portion corresponding to the shallow recessed portion 25 is exposed in the p-MOS region 12. Further, the thin silicon oxide film 24 is also simultaneously removed by the chemical dry etching, so that the first side wall 19 is exposed.

Figure 5T:
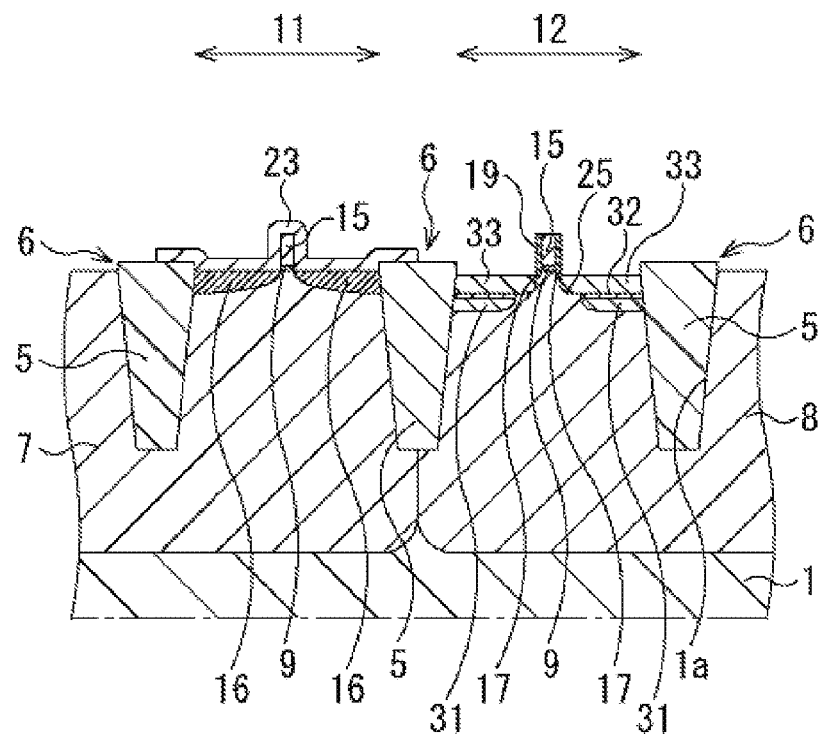
Figure 6G:
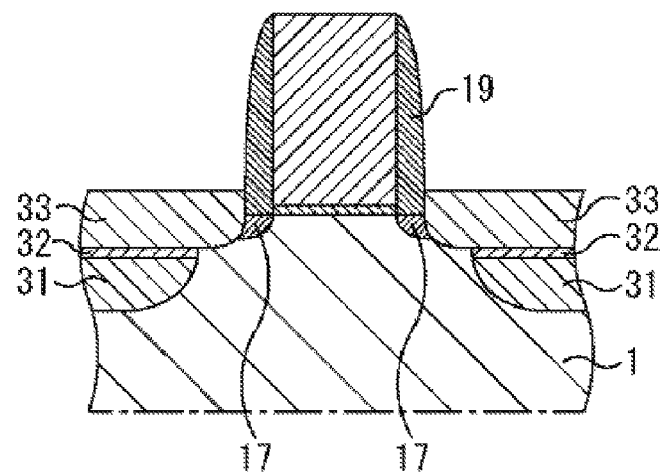

Subsequently, as shown in FIGS. 5T and 6G, a second SiGe layer 33 is formed on the intermediate Si layer 32.

More particularly, an oxide film (not shown) on the intermediate Si layer 32 is first removed by wet etching using HF.

Next, an Si seed layer is formed in a film thickness of about 2 nm on the portion in which the silicon surface is exposed and which corresponds to the recessed portion 25, by a selective epitaxial growth method using a mixed gas of $SiH_4$, $B_2H_6$, $H_2$ and HCl as source gas, at a growth temperature of 600° C. or less. Thereafter, SiGe which is specifically expressed as $Si_{1-x}Ge_x$ where x is set as, for example, $0.20 \leq x \leq 0.30$, and which is here expressed as $Si_{0.72}Ge_{0.28}$ (x=0.28: Ge mole fraction of 0.28), is selectively grown by using a mixed gas of $SiH_4$, $B_2H_6$, $GeH_4$, $H_2$ and HCl as source gas. Thereby, the second SiGe layer 33 is formed in a film thickness of about 10 nm on the intermediate Si layer 32, so as to be embedded into the portion corresponding to the recessed portion 25.

Figure 5U:
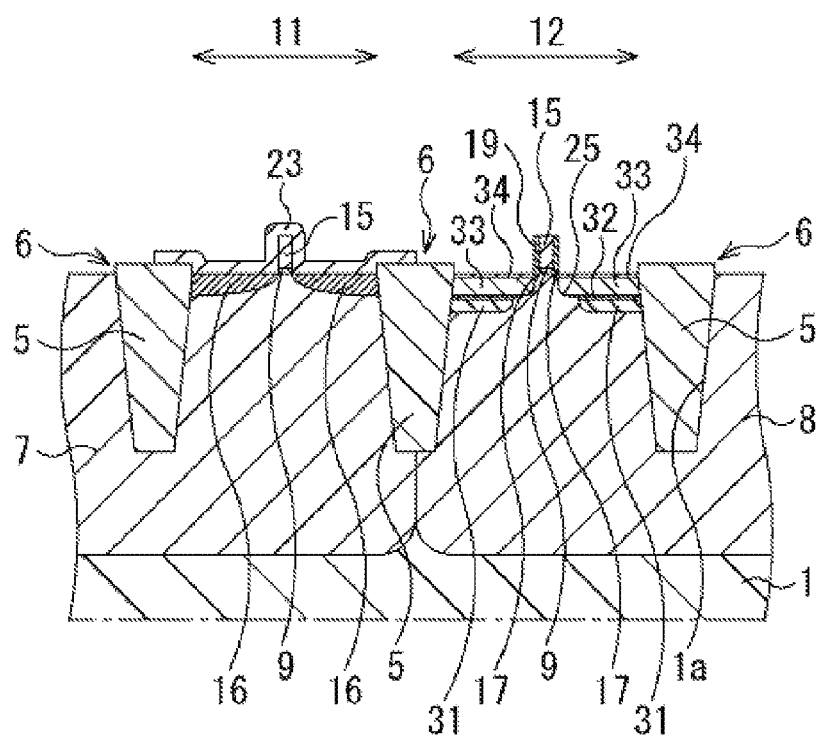
Figure 6H:
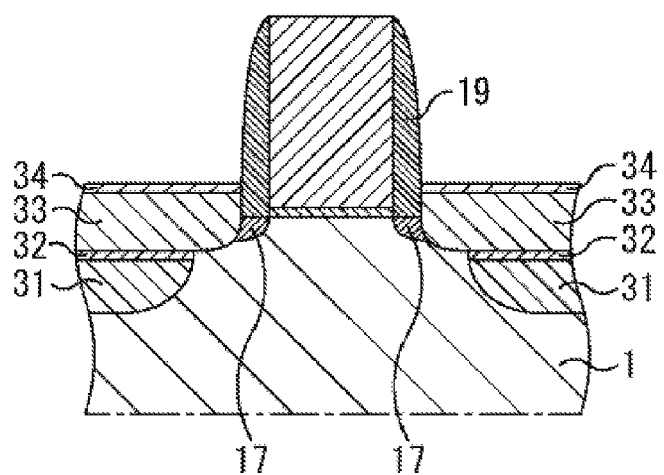

Subsequently, as shown in FIGS. 5U and 6H, an upper Si layer 34 is formed on the second SiGe layer 33.

More particularly, Si is selectively grown on the second SiGe layer 33 by a selective epitaxial growth method using a mixed gas of $SiH_4$, $B_2H_6$ and HCl as source gas at a growth temperature of 600° C. or less. Thereby, the upper Si layer 34 is formed in a film thickness of about 5 nm on the second SiGe layer 33.

Figure 5V:
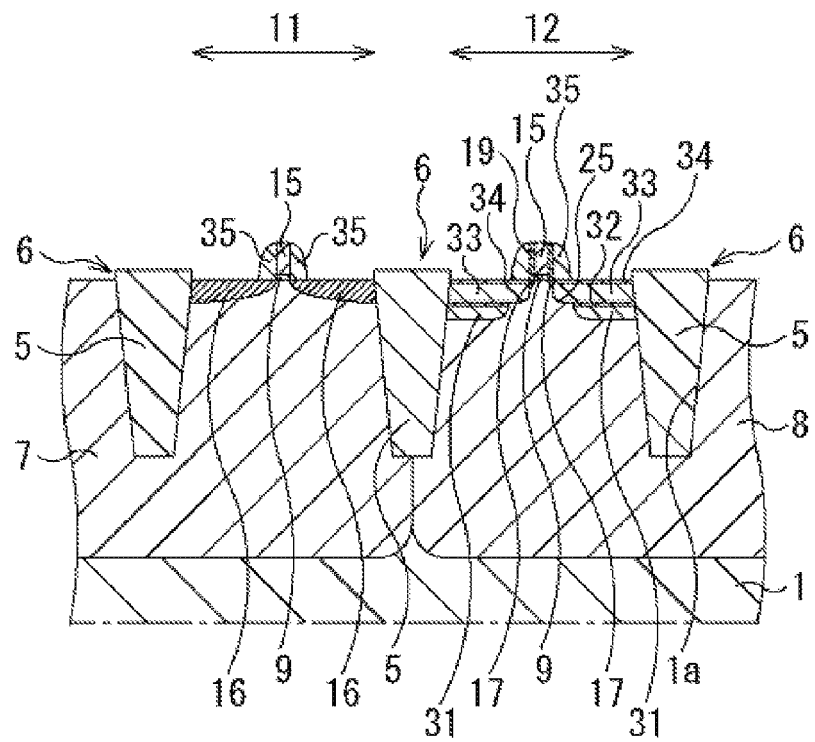

Subsequently, as shown in FIG. 5V, after the oxide film mask 23 is removed, a second side wall 35 is formed.

More particularly, a resist mask (not shown) covering the p-MOS region 12 is first formed, and the oxide film mask 23 in the n-MOS region 11 is removed. Specifically, the oxide film mask 23 as the lower layer is removed by wet etching using, for example, HF.

Thereafter, the resist mask is removed by the ashing treatment and the like.

Next, a film, here a silicon oxide film (not shown), which has a stress smaller than that of the first side wall 19, is formed on the whole surface of the silicon substrate 1 by a CVD method, or the like, at a treatment temperature of 500° C. or less.

Then, the whole surface of the silicon oxide film is subjected to anisotropic dry etching (etched back), so that the silicon oxide film is left on the side surface of the each gate electrode 15. Thereby, the second side wall 35 is formed on the side surface of the gate electrode 15 in the n-MOS region 11, and is formed on the side surface of the gate electrode 15 via the first side wall 19 and on the end portion of the upper Si layer 34 in the p-MOS region 12.

Figure 5W:
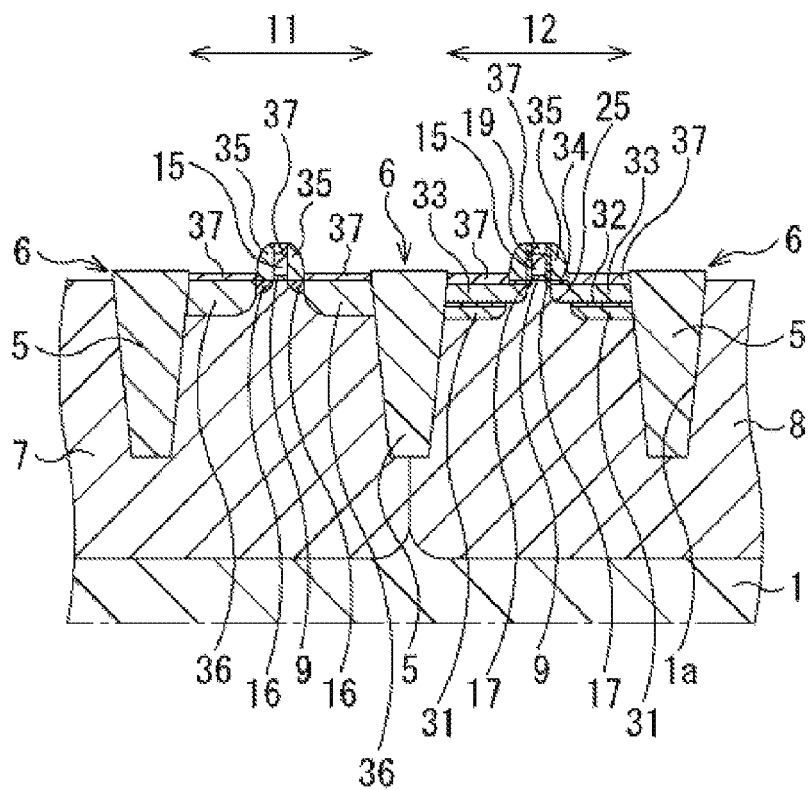
Figure 6I:
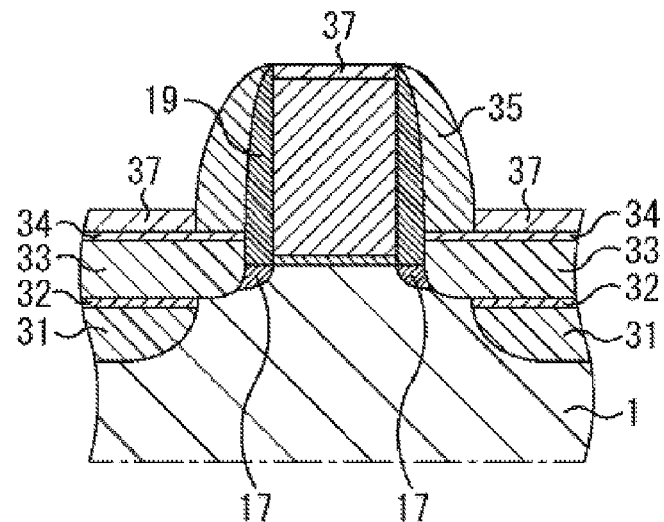

Subsequently, as shown in FIGS. 5W and 6I, after an n-source/drain region 36 is formed in the n-MOS region 11, a silicide process is performed.

More particularly, a resist mask (not shown) covering the p-MOS region 12 is first formed, and the n-type impurity, here phosphorus ($P^+$), is ion-implanted only into the n-MOS region 11 under the condition of an acceleration energy 6.0 keV and a dose amount of $8 \times 10^{15}/cm^2$.

Then, the silicon substrate 1 is subjected to annealing treatment, for example spike annealing treatment, for a very short time at a highest temperature of 950° C., so that the ion-implanted impurity is activated. Thereby, in the n-MOS region 11, there is formed the n-source/drain region 36, which is partially superposed with the n-extension region 16, on the surface layer of the silicon substrate 1 so as to be adjacent to the second side wall 35. By the annealing treatment, various impurities (the impurity of the extension regions 16 and 17 and the impurity of each pocket area) which are ion-implanted in the previous process are also simultaneously activated.

Thereafter, the resist mask is removed by the ashing treatment and the like.

Next, a metal, here a Ni alloy (not shown), which is to be made into silicide, is deposited, by a sputtering method or the like, to a film thickness of, for example, about 20 nm on the whole surface of the silicon substrate 1. Then, the silicon substrate 1 is subjected to rapid thermal processing (RTP) at a temperature of, for example, around 300° C., so that the Ni alloy is made to react with silicon. Thereafter, the unreacted Ni alloy is removed, for example, by persulfuric acid treatment. Further, in order to promote a reduction in the resistance of silicide, additional heat treatment is performed at a temperature of, for example, 400° C. to 500° C. Thereby, a silicide layer 37 is respectively formed on the upper surface portion of the each gate electrode 15, on the portion of the each upper Si layer 34 except the portion under the second side wall 35, and on the upper surface portion of the n-source/drain region 36.

Thereafter, an interlayer insulating film, a contact hole, wiring, and the like, are formed, so that a CMOS transistor according to the present embodiment is completed.

Note that before the interlayer insulating film is formed, a stress film, which functions as an etching stopper at the time of forming the contact hole, may also be formed on the interlayer insulating film.

More particularly, it may be that a tensile film (silicon nitride film) is formed in the n-MOS region 11, and that an compressive film (silicon nitride film) is formed in the p-MOS region 12.

As described above, according to the present embodiment, the operating speed can be increased by significantly improving the current drive capability in such a manner that the strain amount to the channel region is increased while the transistor roll-off characteristic is sufficiently secured by suppressing the generation of dislocation in the SiGe layer. Thereby, a reliable p-channel MOS transistor is realized.

FIGS. 7A to 7L are schematic sectional views showing, in order, main processes of a manufacturing method of a CMOS transistor according to another embodiment.

In the embodiment, respective processes shown in FIGS. 5A to 5K are first performed.

Figure 7A:
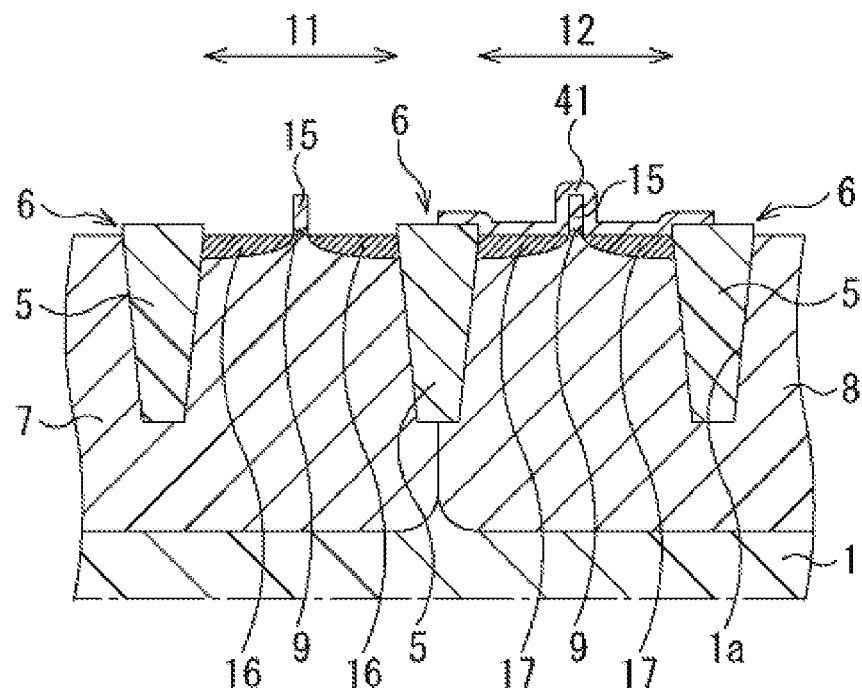
FIGS. 7A to 7L are schematic sectional views showing, in the order of processes, a manufacturing method of a CMOS transistor according to another embodiment.

Subsequently, as shown in FIG. 7A, an oxide film mask 41 covering the p-MOS region 12 is formed.

More particularly, on the whole surface of the silicon substrate 1, a silicon oxide film (not shown) is deposited in a film thickness of about 30 nm by a CVD method, or the like, at a low temperature (of about 400° C. to about 550° C.). Then, the silicon oxide film is processed by lithography and dry etching. Thereby, there is formed the oxide film mask 41 which covers the p-MOS region 12 and which exposes the n-MOS region 11.

Figure 7B:
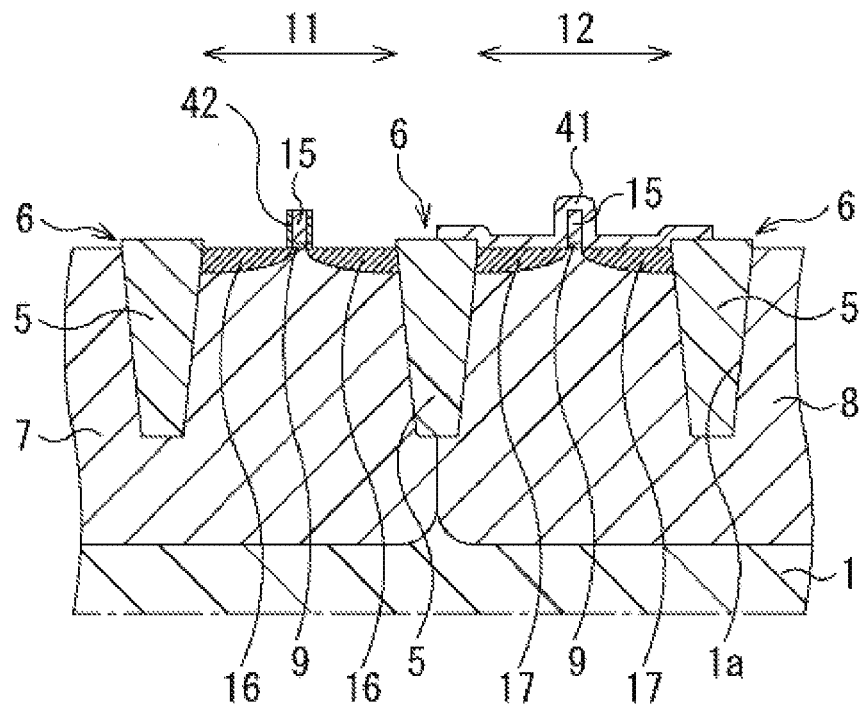

Subsequently, as shown in FIG. 7B, a first side wall 42 is formed on the side surface of the gate electrode 15 in the n-MOS region 11.

More particularly, a contractable film, here a silicon nitride film (not shown), is first formed on the whole surface of the silicon substrate 1. Specifically, a contractable silicon nitride film is formed in a film thickness of, for example, about 10 nm at a treatment temperature of 500° C. or more and less than 600° C.

Next, a resist mask (not shown) covering the p-MOS region 12 on the silicon nitride film is formed, and the whole surface of the silicon nitride film exposed in the n-MOS region 11 is subjected to anisotropic dry etching (etched back), so that the silicon nitride film is left only on the side surface of the gate electrode 15. Thereby, the first side wall 42 is formed on the side surface of the gate electrode 15 in the n-MOS region 11.

Thereafter, the resist mask is removed by the ashing treatment and the like.

Figure 7C:
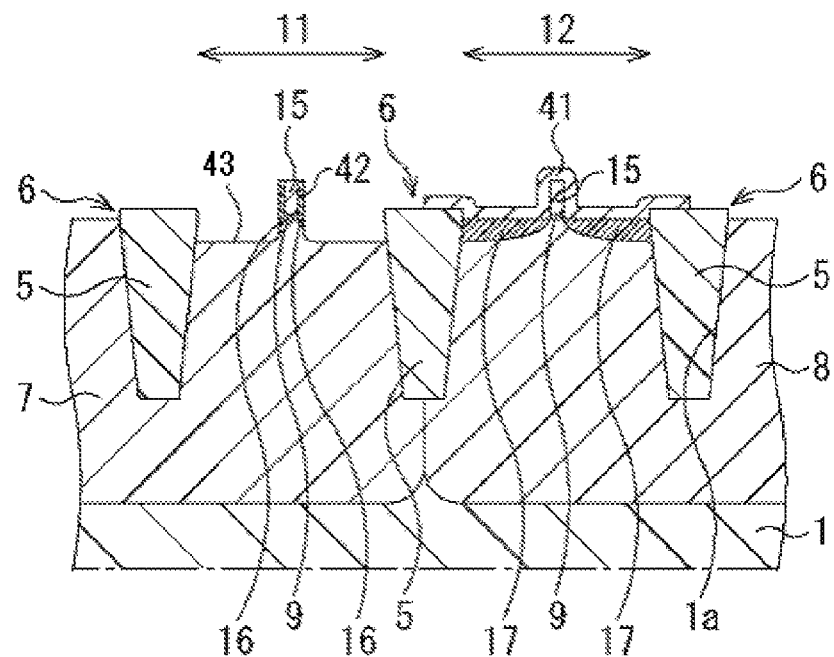

Subsequently, as shown in FIG. 7C, a shallow recessed portion 43 is formed in the n-MOS region 11.

More particularly, the surface of the silicon substrate 1 in the n-MOS region 11 is dry etched to a depth of, for example, about 10 nm. At this time, in the n-MOS region 11, the gate electrode 15 and the side wall 42 serve as a mask, so that the shallow recessed portion 43 is formed on the surface of the silicon substrate 1. Along with the formation of the recessed portion 43, a silicon oxide film 44 is removed except the portion formed on the first side wall 42.

Figure 7D:
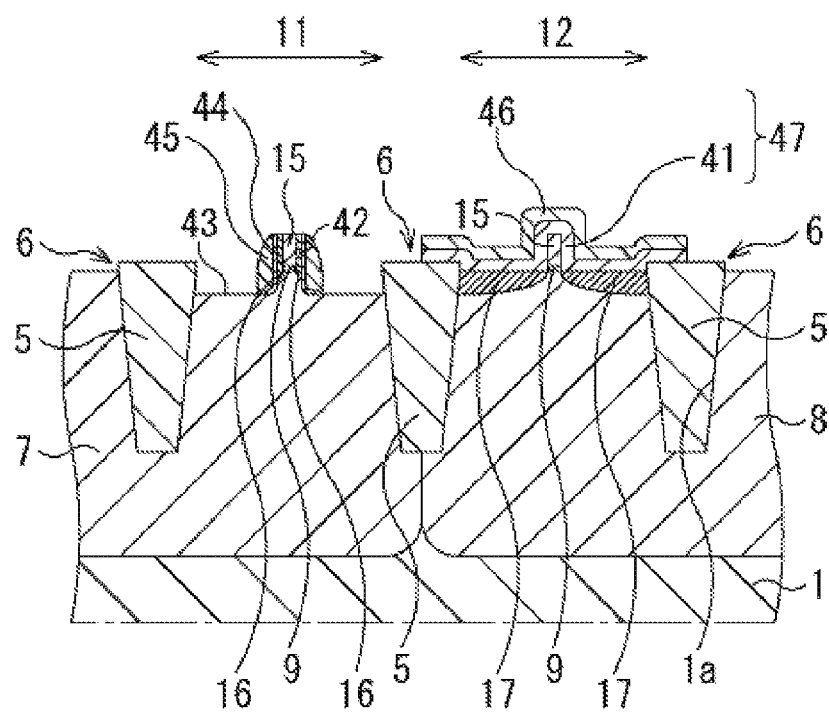

Subsequently, as shown in FIG. 7D, a side wall 45 is formed on the side surface of the gate electrode 15 and at the end portion of the recessed portion 43 in the n-MOS region 11.

More particularly, the thin silicon oxide film 44 is first formed, for example by a CVD method, on the surface of the silicon substrate 1 in the n-MOS region 11 exposed from the oxide film mask 41.

Next, a silicon nitride film (not shown) is formed in a film thickness of, for example, about 20 nm on the whole surface of the silicon substrate 1 by a plasma CVD method at a treatment temperature of 500° C. or more and less than 600° C.

Next, a resist mask (not shown) covering the p-MOS region 12 on the silicon nitride film is formed, and the whole surface of the silicon nitride film exposed in the n-MOS region 11 is subjected to anisotropic dry etching (etched back), so that the silicon nitride film is left only on the side surface of the gate electrode 15 in the n-MOS region 11 exposed from the oxide film mask 41. Thereby, in the n-MOS region 11, the side wall 45 is formed on the side surface of the gate electrode 15 via the first side wall 42 and the silicon oxide film 44, and at the end portion of the recessed portion 43. Along with the formation of the side wall 45, the silicon oxide film 44 is removed except the portion formed under the side wall 45.

Thereafter, the resist mask formed in the p-MOS region 12 is removed by the ashing treatment and the like. At this time, the silicon nitride film is left in the p-MOS region 12, so that a nitride film mask 46 (including the silicon nitride film at the time of formation of the first side wall 42) is formed on the oxide film mask 41. Hereinafter, the laminated body of the oxide film mask 41 and the nitride film mask 46 is referred to as a laminated mask 47.

Figure 7E:
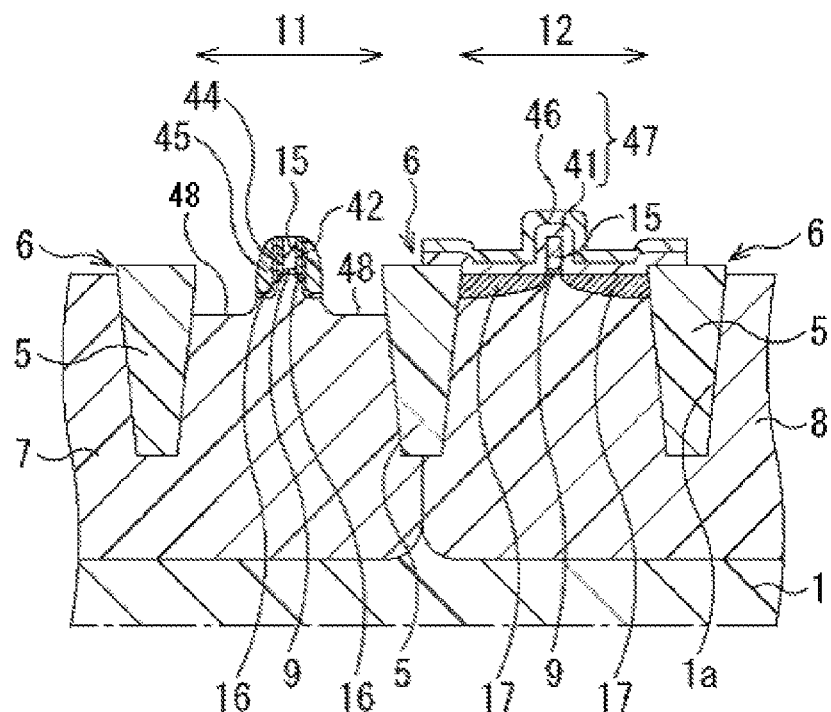

Subsequently, as shown in FIG. 7E, a deep recessed portion 48 is formed in the n-MOS region 11.

More particularly, the surface of the silicon substrate 1 in the n-MOS region 11 is dry etched to a depth of, for example, about 30 nm. At this time, in the n-MOS region 11, the gate electrode 15, the first side wall 42, the silicon oxide film 44, and the side wall 45 serve as a mask, so that the bottom surface of the recessed portion 43 is etched. As a result, the deep recessed portion 48 is formed.

Thereafter, the inner wall surface of the recessed portion 48 is wet etched about 10 nm by using, for example, an alkali acid (TMAH or the like) for smooth treatment of the inner wall surface of the recessed portion 48. Thereby, the depth of the recessed portion 48 is set to about 40 nm on the basis of the surface of the silicon substrate 1.

Figure 7F:
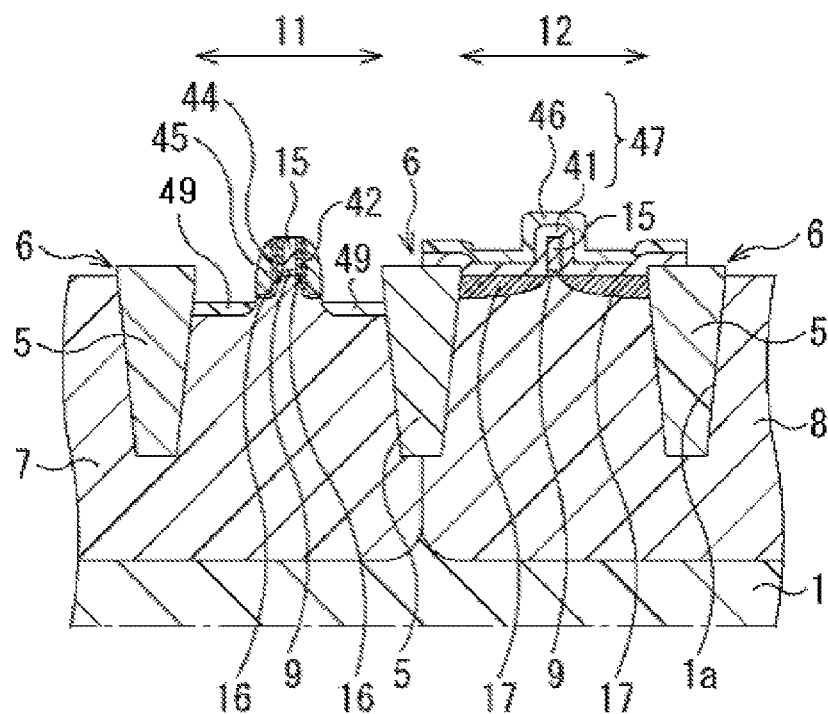

Subsequently, as shown in FIG. 7F, there is formed a first SiC layer 49 which is embedded into the recessed portion 48 at a predetermined depth.

More particularly, SiC which is specifically expressed as $Si_{1-y}C_y$, where y is set as, for example, $0.008 \leq y \leq 0.015$, and which is here expressed as $Si_{0.992}C_{0.008}$ (y=0.008: C mole fraction of 0.008), is selectively grown in the recessed portion 48 in which the silicon surface is exposed, by a selective epitaxial growth method using a mixed gas of $SiH_4$, $SiCH_6$, $PH_3$, $H_2$ and HCl as source gas at a growth temperature of 600° C. or less. Thereby, the first SiC layer 49 is formed in the recessed portion 48 at the predetermined depth. The first SiC layer 49 is set to be formed to such an extent that the first SiC layer 49 and the intermediate Si layer as will be described below are embedded together into the recessed portion 48. The film thickness of the first SiC layer 49 is set to, for example, about 30 nm. At this time, the doping amount of phosphorus ($P^+$) into the first SiC layer 49 is, for example, about 1 mΩ·cm expressed in terms of resistivity.

Figure 7G:
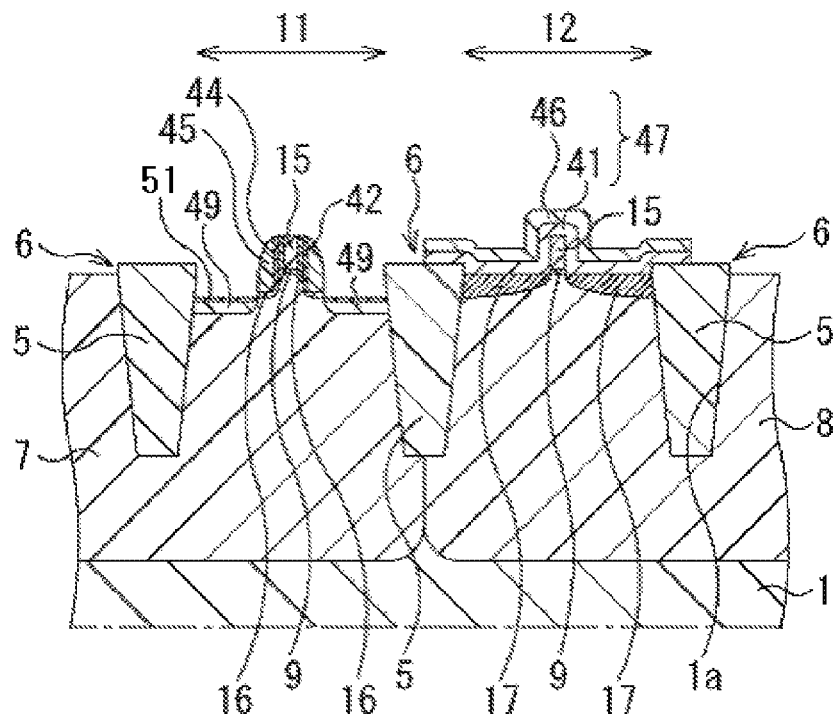

Subsequently, as shown in FIG. 7G, an intermediate Si layer 51 is formed on the first SiC layer 49.

More particularly, Si is selectively grown on the first SiC layer 49 by a selective epitaxial growth method using a mixed gas of $SiH_4$, $PH_3$ and $H_2$ as source gas, at a growth temperature of 600° C. or less. Thereby, the intermediate Si layer 51 is formed. The intermediate Si layer 51 is set to be formed to such an extent that the first SiC layer 49 and the intermediate Si layer 51 are embedded together into the recessed portion 48. The film thickness of the intermediate Si layer 51 is set to about 10 nm.

Figure 7H:
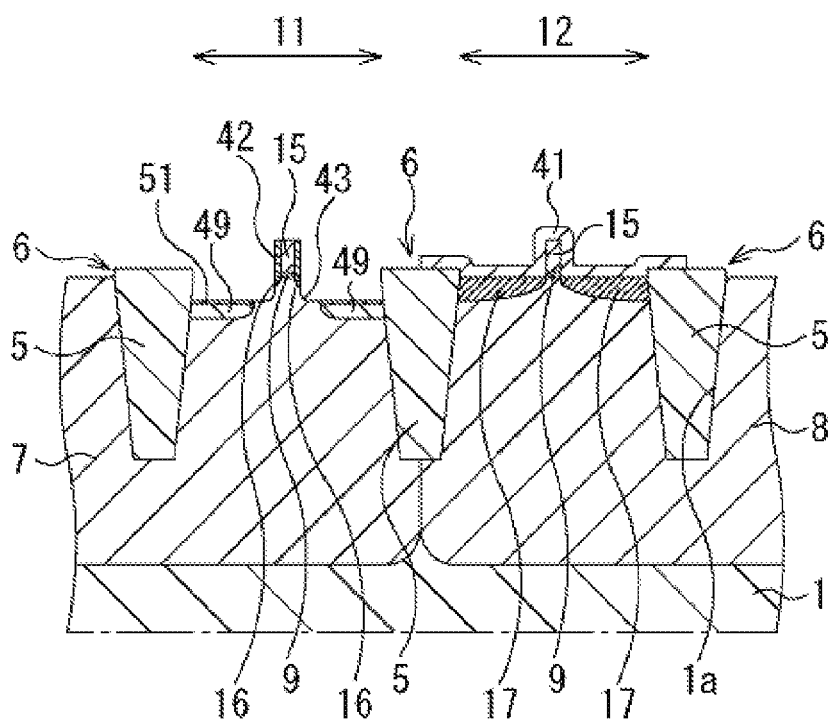

Subsequently, as shown in FIG. 7H, the side wall 45 is removed.

More particularly, the side wall 45 in the n-MOS region 11 is removed by chemical dry etching. At this time, the nitride film mask 46 of the laminated mask 47 is also simultaneously removed in the p-MOS region 12. Thereby, in the n-MOS region 11, a portion corresponding to the shallow recessed portion 43 is made to appear. Further, the thin silicon oxide film 44 is also simultaneously removed by the chemical dry etching, so that the first side wall 42 is exposed.

Figure 7I:
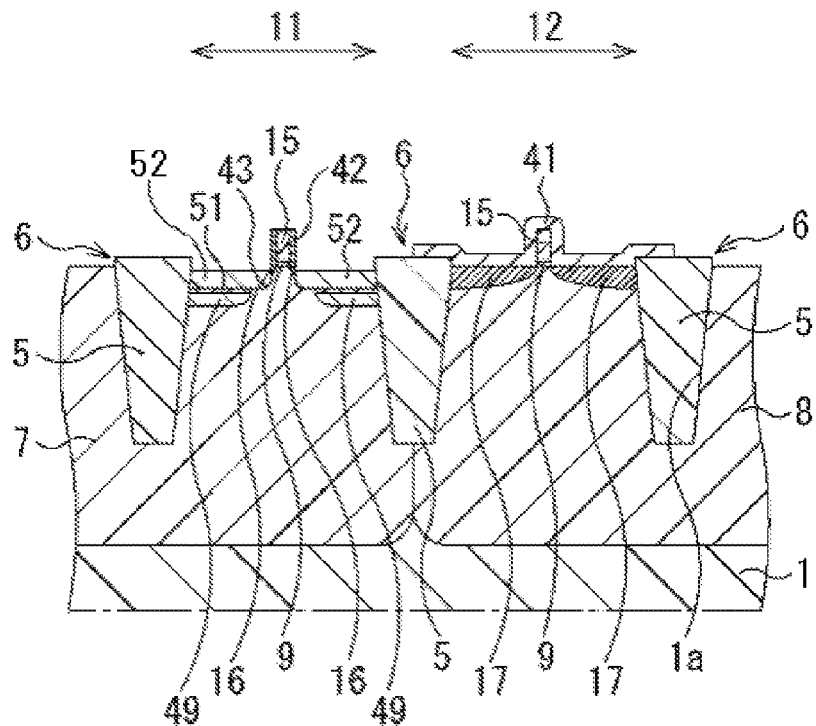

Subsequently, as shown in FIG. 7I, a second SiC layer 52 is formed on the intermediate Si layer 51.

More particularly, the oxide film (not shown) on the intermediate Si layer 51 is first removed by wet etching using HF.

Next, a Si seed layer is formed in a film thickness of about 2 nm on a portion corresponding to the recessed portion 43 in which the silicon surface is exposed, by a selective epitaxial growth method using a mixed gas of $SiH_4$, $PH_3$ and $H_2$ as source gas, at a growth temperature of 600° C. or less. Thereafter, SiC which is specifically expressed as $Si_{1-y}C_y$, where y is set as, for example, $0.015 \leq y \leq 0.025$, and which is here expressed as $Si_{0.98}C_{0.02}$ (y=0.02: C mole fraction of 0.02), is selectively grown, by using a gas of $SiH_4$, $SiCH_6$, $PH_3$ and $H_2$ as source gas. Thereby, the second SiC layer 52 is formed in a film thickness of about 10 nm on the intermediate Si layer 51, so as to be embedded into the portion corresponding to the recessed portion 43.

Figure 7J:
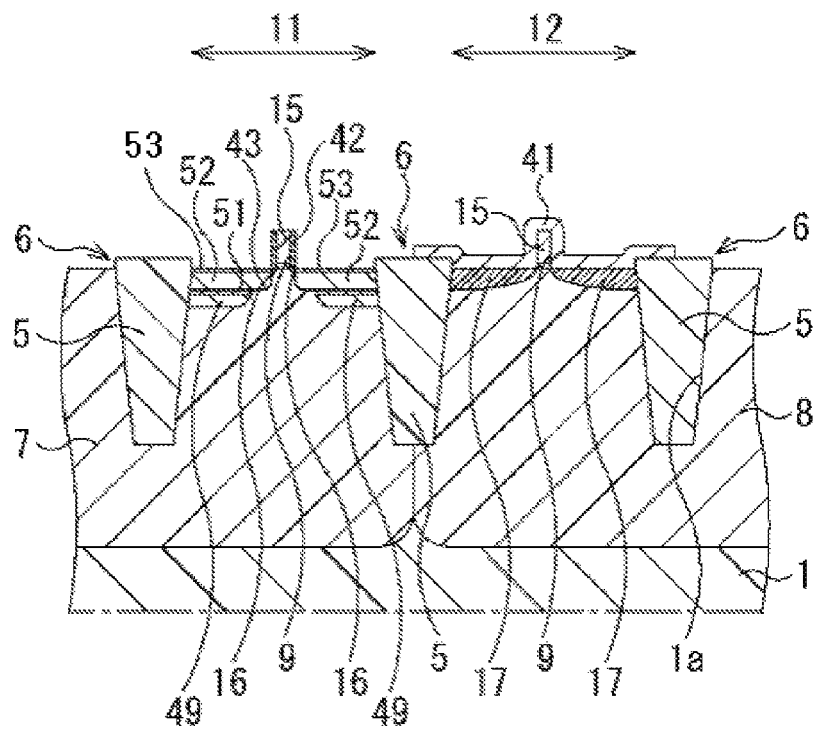

Subsequently, as shown in FIG. 7J, an upper Si layer 53 is formed on the second SiC layer 52.

More particularly, Si is selectively grown on the second SiC layer 52 by a selective epitaxial growth method using a mixed gas of $SiH_4$, $PH_3$ and $H_2$ as source gas, at a growth temperature of 600° C. or less. Thereby, the upper Si layer 53 is formed in a film thickness of about 5 nm on the second SiC layer 52.

Figure 7K:
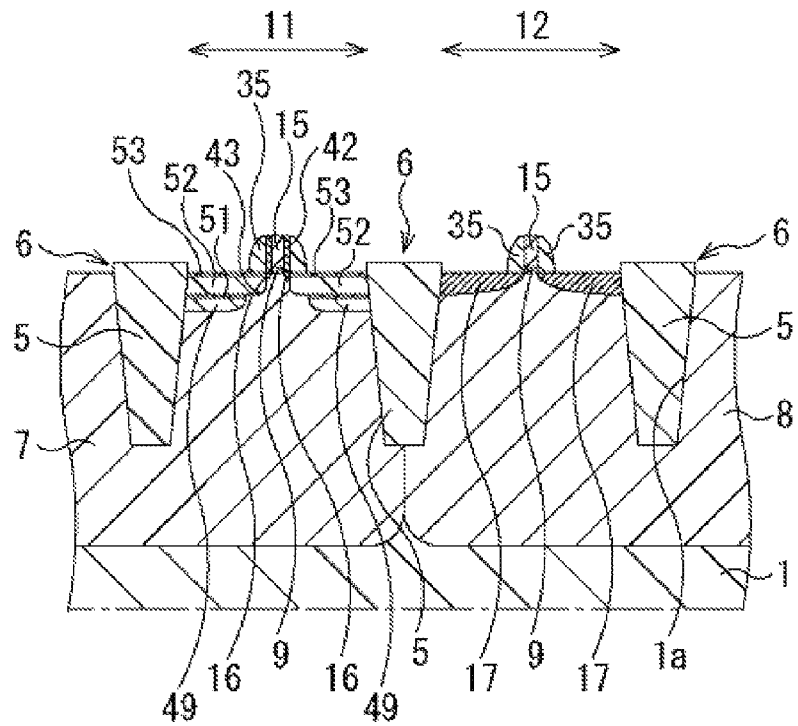

Subsequently, as shown in FIG. 7K, after the oxide film mask 41 is removed, the second side wall 35 is formed.

More particularly, a resist mask (not shown) covering the n-MOS region 11 is first formed, and the oxide film mask 41 in the p-MOS region 12 is removed. Specifically, the oxide film mask 41 as the lower layer is removed, for example, by wet etching using HF.

Thereafter, the resist mask is removed by the ashing treatment and the like.

Next, a film, here a silicon oxide film (not shown), which has a lower stress than the first side wall 42, is formed on the whole surface of the silicon substrate 1 by a CVD method, or the like, at a treatment temperature of 500° C. or less.

Then, the whole surface of the silicon oxide film is subjected to anisotropic dry etching (etched back), so that the silicon oxide film is left only on the side surface of the each gate electrode 15. Thereby, the second side wall 35 is respectively formed on the side surface of the gate electrode 15 via the first side wall 42, and on the end portion of the upper Si layer 51 in the n-MOS region 11, and formed on the side surface of the gate electrode 15 in the p-MOS region 12.

Figure 7L:
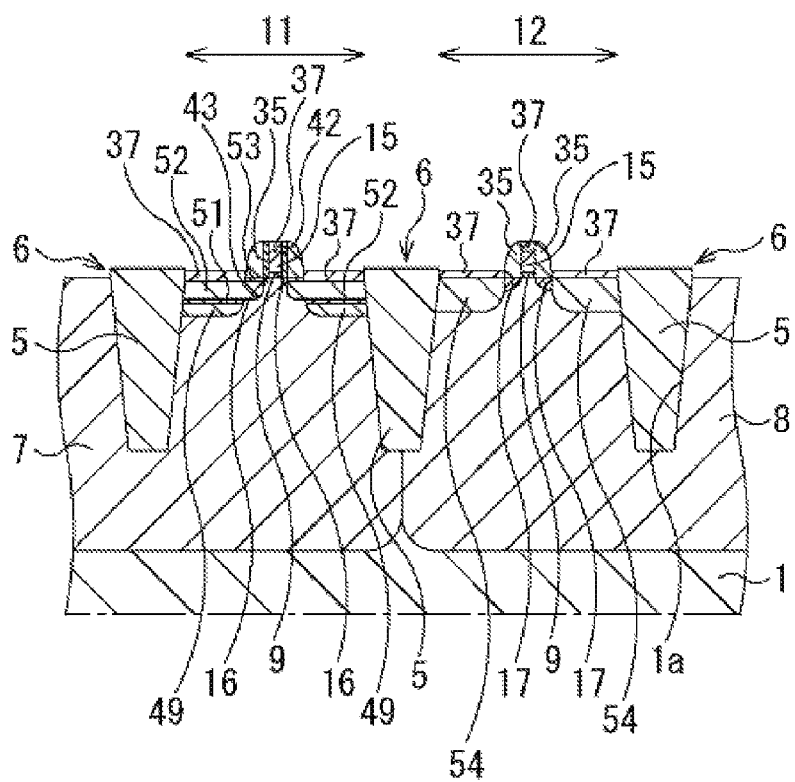

Subsequently, as shown in FIG. 7L, after a p-source/drain region 54 is formed in the p-MOS region 12, a silicide process is performed.

More particularly, a resist mask (not shown) covering the n-MOS region 11 is first formed, and the p-type impurity, here boron ($B^+$), is ion-implanted only into the p-MOS region 12 under the condition of an accelerating energy of 3 keV and a dose amount of $5 \times 10^{15}/cm^2$.

Then, the silicon substrate 1 is subjected to annealing treatment, for example, spike annealing treatment, for a very short time at a temperature of 950° C., so that the ion-implanted impurity is activated. Thereby, the p-source/drain region 54, which is partially superposed with the p-extension region 17 on the surface layer of the silicon substrate 1, is formed so as to be adjacent to the second side wall 35 in the p-MOS region 12. By the annealing treatment, various impurities (the impurity of the extension regions 16 and 17 and the impurity of the each pocket region) which are ion-implanted in the previous process, are also simultaneously activated.

Thereafter, the resist mask is removed by the ashing treatment and the like.

Next, a metal, here a Ni alloy (not shown), which is to be made into silicide, is deposited on the whole surface of the silicon substrate 1 in a film thickness of, for example, about 10 nm by a sputtering method, or the like. Then, the silicon substrate 1 is subjected to RTP treatment at a temperature of, for example, around 300° C., so that the Ni alloy is made to react with silicon. Thereafter, the unreacted Ni alloy is removed, for example, by persulfuric acid treatment. Further, in order to promote the reduction in the resistance of silicide, additional heat treatment is performed at a temperature of, for example, 400° C. to 500° C. Thereby, the silicide layer 37 is respectively formed on the upper surface portion of the each gate electrode 15, on the portion of the each upper Si layer 43 except the portion under the second side wall 35, and on the upper surface portion of the p-source/drain region 54.

Thereafter, after an interlayer insulation film, a contact hole, a wiring, and the like, are formed, a CMOS transistor according to the present embodiment is completed.

Note that before the interlayer insulation film is formed, there may also be formed a stress film which functions as an etching stopper at the time when the contact hole is formed on the interlayer insulation film.

More particularly, it may be that a tensile film (silicon nitride film) with respect to the silicon substrate 1 is formed in the n-MOS region 11, and that an compressive film (silicon nitride film) with respect to the silicon substrate 1 is formed in the p-MOS region 12.

As described above, according to the present embodiment, the operating speed can be increased by significantly improving the current drive capability in such a manner that the distortion amount to the channel region is increased while the transistor roll-off characteristic is sufficiently secured by suppressing the generation of dislocation in the SiC layer. As a result, a highly reliable n-channel MOS transistor is realized.

The present invention is not limited to the above described embodiment. Various changes and modifications maybe made in the described embodiment without departing from the gist of the invention.

What is claimed is:

1. A method of manufacturing a semiconductor device, the method comprising:
    forming a gate insulating film over a semiconductor substrate, and a gate electrode on the gate insulating film;
    forming a first side wall on a side surface of the gate electrode;
    forming a first recessed portion in the semiconductor substrate by using the gate electrode and the first side wall as a mask;
    forming a second side wall on the first side wall;
    forming a second recessed portion in the semiconductor substrate by using the gate electrode and the second side wall as a mask;
    subsequently forming a first semiconductor layer in the second recessed portion;
    after forming the first semiconductor layer, removing the second side wall;
    after removing the second side wall, forming a second semiconductor layer in the first recessed portion;
    wherein the first semiconductor layer and the second semiconductor layer comprise Si and a 4B group element other than Si, and
    wherein a mole fraction of the 4B group element other than Si in the second semiconductor layer is higher than a mole fraction of the 4B group element other than Si in the first semiconductor layer.

2. The method according to claim 1,
    wherein the 4B group element other than Si in the first semiconductor layer and the 4B group element other than Si in the second semiconductor layer are Ge or C.

3. The method according to claim 1, further comprising:
    forming, after forming the first semiconductor layer, a third semiconductor layer on the first semiconductor layer before forming the second semiconductor layer.

4. The method according to claim 3,
    wherein the third semiconductor layer comprises Si or comprises Si and a 4B group element other than Si, and
    wherein a mole fraction of the 4B group element other than Si in the third semiconductor layer is lower than the mole fraction of the 4B group element other than Si in the first semiconductor layer.

5. The method according to claim 4, wherein the 4B group element other than Si in the second semiconductor layer is Ge or C.

6. The method according to claim 3, further comprising:
    forming, after forming of the second semiconductor layer, a fourth semiconductor layer on the second semiconductor layer.

7. The method according to claim 6,
    wherein the fourth semiconductor layer comprises Si or comprises Si and a 4B group element other than Si, and
    wherein a composition ratio of the 4B group element other than Si in the fourth semiconductor layer is lower than a composition of the 4B group element other than Si in the first semiconductor layer.

8. The method according to claim 7,
    wherein the 4B group element other than Si in the second semiconductor layer is Ge or C.

9. The method according to claim 1,
    wherein the mole fraction of the 4B group element other than Si in the second semiconductor layer is $0.20 < x \leq 0.30$ and the mole fraction of the 4B group element other than Si in the first semiconductor layer is $0.15 \leq x \leq 0.20$, and
    wherein the 4B group element other than Si in the first semiconductor layer and the 4B group element other than Si in the second semiconductor layer are Ge.

* * * * *